United States Patent
Ross

(10) Patent No.: US 9,820,408 B2
(45) Date of Patent: Nov. 14, 2017

(54) SYSTEM WITH HALF-DEPTH SERVERS

(71) Applicant: Amazon Technologies, Inc., Reno, NV (US)

(72) Inventor: Peter George Ross, Olympia, WA (US)

(73) Assignee: Amazon Technologies, Inc., Reno, NV (US)

( * ) Notice: Subject to any disclaimer, the term of this patent is extended or adjusted under 35 U.S.C. 154(b) by 43 days.

(21) Appl. No.: 14/841,322

(22) Filed: Aug. 31, 2015

(65) Prior Publication Data

US 2015/0373881 A1    Dec. 24, 2015

Related U.S. Application Data

(63) Continuation of application No. 13/791,192, filed on Mar. 8, 2013, now Pat. No. 9,122,462, and a continuation of application No. 12/886,472, filed on Sep. 20, 2010, now Pat. No. 8,400,765.

(51) Int. Cl.
*H05K 7/20* (2006.01)
*G06F 1/20* (2006.01)

(52) U.S. Cl.
CPC ........... *H05K 7/20718* (2013.01); *G06F 1/20* (2013.01); *H05K 7/20727* (2013.01); *H05K 7/20836* (2013.01)

(58) Field of Classification Search
CPC combination set(s) only.
See application file for complete search history.

(56) References Cited

U.S. PATENT DOCUMENTS

| | | |
|---|---|---|
| 4,932,522 A | 6/1990 | Milovich |
| 6,064,567 A | 5/2000 | Cheng |
| 6,225,911 B1 | 5/2001 | Nagamasa et al. |
| 6,259,605 B1 | 7/2001 | Schmitt |
| 6,590,768 B1 | 7/2003 | Wiley |
| 6,621,693 B1 | 9/2003 | Potter et al. |
| 6,791,836 B2 | 9/2004 | Cipolla et al. |
| 6,826,036 B2 * | 11/2004 | Pereira ............. G06F 1/189 361/624 |
| 7,031,154 B2 | 4/2006 | Bash et al. |
| 7,173,821 B2 * | 2/2007 | Coglitore .......... G06F 1/189 307/65 |

(Continued)

FOREIGN PATENT DOCUMENTS

| | | |
|---|---|---|
| CN | 1538805 | 10/2004 |
| CN | 101547588 | 9/2009 |

(Continued)

OTHER PUBLICATIONS

Office Action from Canadian Application No. 2,858,200, dated Aug. 26, 2015, Amazon Technologies, Inc., pp. 1-5.

(Continued)

*Primary Examiner* — Lisa Lea Edmonds
(74) *Attorney, Agent, or Firm* — Robert C. Kowert; Meyertons, Hood, Kivlin, Kowert & Goetzel, P.C.

(57) ABSTRACT

A computer system includes a chassis, one or more hard disk drives coupled to the chassis, and one or more air passages under at least one of the hard disk drives. The air passages include one or more air inlets and one or more air outlets. The inlets direct at least a portion of the air downwardly into the passages. The passages allow air to move from the air inlets to the air outlets.

20 Claims, 20 Drawing Sheets

(56) References Cited

U.S. PATENT DOCUMENTS

| | | | |
|---|---|---|---|
| 7,196,900 B2 * | 3/2007 | Ewing | H02B 1/306 174/59 |
| 7,215,535 B2 * | 5/2007 | Pereira | G06F 1/189 174/59 |
| 7,268,998 B2 * | 9/2007 | Ewing | H05K 7/1492 174/59 |
| 7,283,358 B2 | 10/2007 | Campbell et al. | |
| 7,304,841 B2 | 12/2007 | Lee et al. | |
| 7,351,137 B2 | 4/2008 | Su | |
| 7,529,097 B2 * | 5/2009 | Coglitore | H05K 7/1488 211/153 |
| 7,567,430 B2 * | 7/2009 | Ewing | H01H 85/0241 174/50 |
| 7,869,210 B2 | 1/2011 | Moss | |
| 7,957,132 B2 | 6/2011 | Fried | |
| 8,238,080 B2 * | 8/2012 | McGinn | H05K 7/1492 307/112 |
| 8,400,765 B2 | 3/2013 | Ross | |
| 8,817,463 B1 * | 8/2014 | Rose | G06F 1/181 174/500 |
| 2003/0063431 A1 | 4/2003 | Sobolewski | |
| 2004/0218355 A1 | 11/2004 | Bash et al. | |
| 2004/0233643 A1 | 11/2004 | Bolich et al. | |
| 2005/0166860 A1 | 8/2005 | Austin et al. | |
| 2005/0237716 A1 | 10/2005 | Chu et al. | |
| 2005/0265004 A1 | 12/2005 | Coglitore et al. | |
| 2005/0286222 A1 | 12/2005 | Lucero et al. | |
| 2006/0061955 A1 | 3/2006 | Imblum | |
| 2006/0274496 A1 | 12/2006 | Lee et al. | |
| 2007/0109736 A1 * | 5/2007 | Coglitore | G06F 1/189 361/679.59 |
| 2007/0171613 A1 | 7/2007 | McMahan et al. | |
| 2008/0112127 A1 | 5/2008 | June et al. | |
| 2008/0191590 A1 | 8/2008 | Lin et al. | |
| 2008/0285232 A1 | 11/2008 | Claassen et al. | |
| 2009/0086441 A1 * | 4/2009 | Randall | H05K 7/1492 361/724 |
| 2010/0103633 A1 | 4/2010 | Fujimura et al. | |
| 2010/0271766 A1 | 10/2010 | Lin | |
| 2011/0284422 A1 | 11/2011 | Yamada | |
| 2012/0061536 A1 | 3/2012 | Felcman et al. | |
| 2013/0155600 A1 | 6/2013 | Ross et al. | |

FOREIGN PATENT DOCUMENTS

| | | |
|---|---|---|
| CN | 101719376 | 6/2010 |
| EP | 2202751 | 6/2010 |
| JP | 2000077875 | 3/2000 |
| JP | 2004241655 | 8/2004 |
| JP | 2007250596 | 9/2007 |
| JP | 2007300037 | 11/2007 |
| JP | 2008159747 | 7/2008 |
| WO | 2004114286 | 12/2004 |

OTHER PUBLICATIONS

The First Office Action and Written Opinion for Chinese Application No. 201280061472.7, dated Nov. 19, 2015, Amazon Technologies, Inc., pp. 1-18.
Office Action from Japanese Application No. 2015-30790, dated Mar. 25, 2016, Amazon Technologies, Inc., pp. 1-6.
Office Action from Canadian Application No. 2,812,190, dated Aug. 12, 2016, Amazon Technologies, Inc., pp. 1-5.
U.S. Appl. No. 12/886,469, filed Sep. 20, 2010.
U.S. Appl. No. 12/886,440, filed Sep. 20, 2010, Peter G. Ross et al.
U.S. Appl. No. 12/886,437, filed Sep. 20, 2010, Peter G. Ross et al.
International Search Report for PCT/US2011/051139, dated Dec. 6, 2011, Amazon Technologies, Inc., 10 pages.
Office Action from Chinese Application No. 201180045095.3, dated Jan. 6, 2014, English and Chinese versions, pp. 1-11.
Office Action from Japanese Application No. 2013-529211, dated Mar. 18, 2014, Japanese and English Versions, pp. 1-7.
U.S. Appl. No. 13/791,192, filed Mar. 8, 2013, Peter George Ross.
Office Action from Canadian Application No. 2,812,190, dated Jul. 13, 2015, Amazon Technologies, Inc., pp. 1-5.
Patent Examination Report No. 1 from Australian Application No. 2015201684, dated Feb. 15, 2016, Amazon Technologies, Inc., pp. 1-4.
Office Action from Chinese Application No. 201510039269.5, dated Jun. 28, 2017, Amazon Technologies, Inc., pp. 1-15.

* cited by examiner

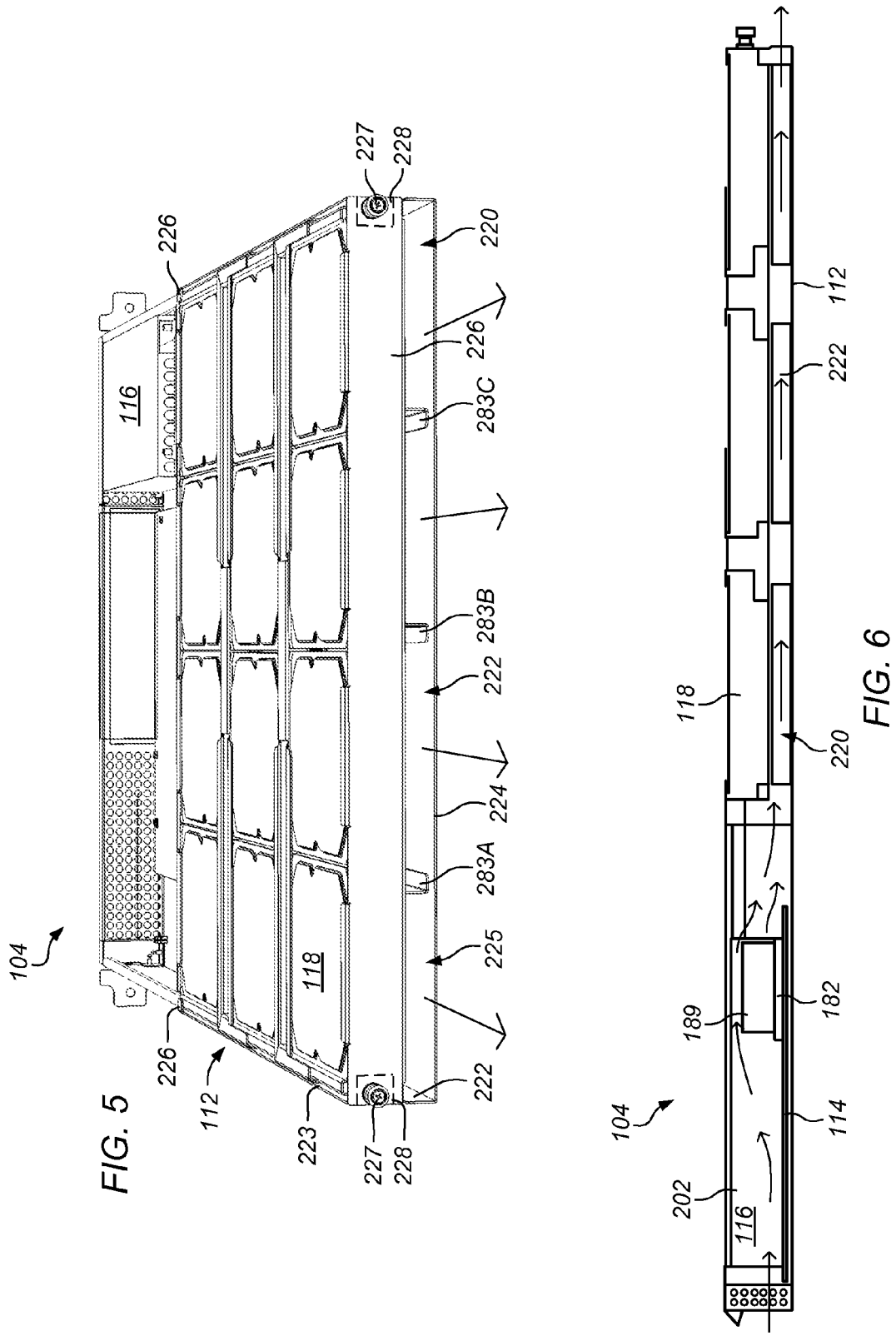

SYSTEM WITH HALF-DEPTH SERVERS

This application is a continuation of U.S. application Ser. No. 13/791,192, filed Mar. 8, 2013, now U.S. Pat. No. 9,122,462, which is a continuation of U.S. application Ser. No. 12/886,472, filed Sep. 20, 2010, now U.S. Pat. No. 8,400,765, which are hereby incorporated by reference in their entireties.

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Computer systems typically include a number of components that generate waste heat. Such components include printed circuit boards, mass storage devices, power supplies, and processors. For example, some computers with multiple processors may generate 250 watts of waste heat. Some known computer systems include a plurality of such larger, multiple-processor computers that are configured into rack-mounted components, and then are subsequently positioned within a rack system. Some known rack systems include 40 such rack-mounted components and such rack systems will therefore generate as much as 10 kilowatts of waste heat. Moreover, some known data centers include a plurality of such rack systems.

In some computer systems, a rack-level power distribution unit is provided in a rack to distribute electrical power to the many servers in the rack. The rack-level power distribution unit may include a large number of receptacles, each of which may be used to supply power to a different server. Rack-level power distribution units may be attached to one or both interior sides of the rack near one end of the rack. This mounting may place the receptacles of the power distribution unit in close proximity to the server power supplies. Such a mounting may, however, interfere with installation and removal of the server racks (for example, by obstructing the path of a server as it is slid into or out of the rack).

In one existing arrangement for a rack-based computer system, cooling air is introduced at the front end of a rack and into the front of servers mounted in the rack. Heated air is expelled through the rear of the server chassis and then exits through the rear of the rack. In many systems, electrical connections for power and data are at also located the rear of the rack system, along with associated equipment for the electrical connections such as rack-level power distribution units. With the electrical connections located at hot end of the rack, personnel may be forced to work in a hot environment to maintain the servers (for example, to connect and disconnect power and data cables). In addition, high temperatures at the rear of the rack may cause failures in the rack-level power distribution units (for example, due to thermal overload of breakers in the power distribution units).

A source of heat in many servers comes from on-board power supply units in the servers. Power supply units that are not properly cooled may be susceptible to failure. Many standard power supply units include an internal fan that draws air from inside the server chassis into the power supply case and then expels heated air to a location external to the server through a face panel in the power supply unit. This arrangement may be effective in cooling electrical components in the power supply unit. In some cases, however, the heat air expelled from the power supply unit may adversely affect cooling of other components in the server or in other parts of the system. For example, air expelled from a power supply unit may pre-heat air being introduced into a server chassis to cool critical components in the server, such as a central processing unit.

Some servers include a substantial number of hard disk drives (for example, eight or more hard disk drives) to provide adequate data storage. The hard disk drives include motors and electronic components that generate heat, which must be removed from the hard disk drives to maintain operation of the servers. This heat is sometimes removed by passing air over and on the sides the cases of the hard disk drives. In many existing servers, the hard disk drives are laterally spaced from one another to allow air to pass between adjacent hard disk drives to cool of the hard disk drives. Such lateral spacing may be needed to ensure adequate cooling of the hard disk drives, but also may have the effect of limiting the maximum density of the hard drives (that is, the number of hard disk drives that can be provided in a given amount of space in the server.)

Some data centers rely on DC-powered fans internal to servers to produce airflow through the servers in a rack system. Such fans may be, however, inefficient and prone to failure, and add to the costs and complexity of the servers. DC fans also require power conversion equipment (either internal or external to the servers) to supply the DC power for the fans.

BRIEF DESCRIPTION OF THE DRAWINGS

FIG. 5 illustrates a rear view of a computer system including a hard disk drive tray.

FIG. 6 is a schematic side view illustrating air flow through a computer system according to one embodiment.

Figure 1:
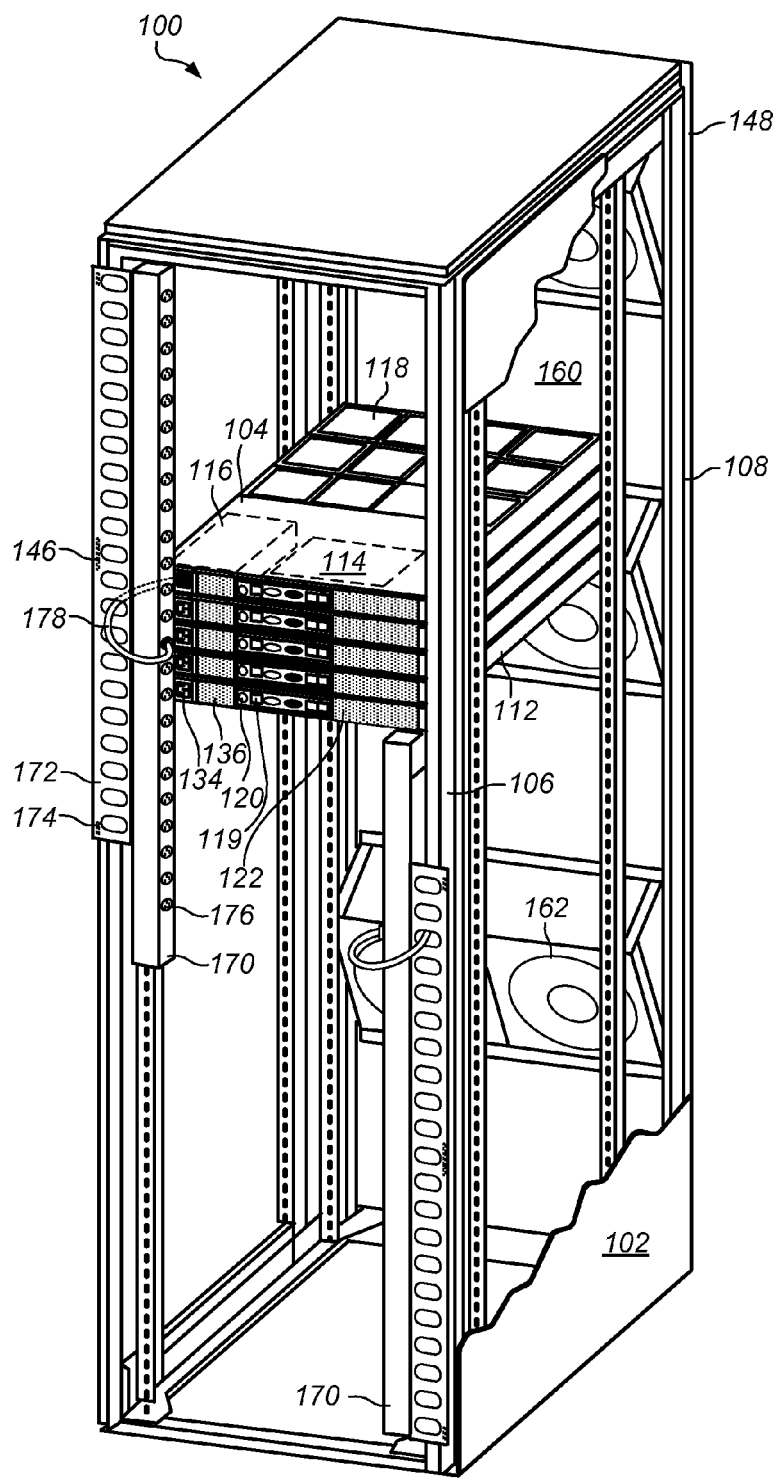
FIG. 1 illustrates one embodiment of a system that includes electrical connections and intake vents at the front end of a rack system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of computer systems, and systems and methods of cooling computer systems, are disclosed. According to one embodiment, a data center includes a row of one or more racks. Computer systems (such as servers) are mounted in the racks. A cold aisle is on a first side of the rack row and a hot aisle is on the second side of the rack row. An air handling system moves air from the cold aisle on the first side of the row of racks through computer systems in at least one of the racks and exhausts air from the computer systems into the hot aisle on the second side of the row of racks. The computer systems include input/output connectors, power input connectors, and power supply air inlets on the first side (cold-aisle side) of the row. One or more power rack power distribution units may be provided on the first side (cold-aisle side) of the row.

According to one embodiment, a system includes a rack and one more computer systems (such as servers) mounted in the rack. The computer systems may include an air intake side including air inlets, an air exhaust side including air outlets, and a power supply unit. One or more fans move air through at least one of the air inlets of the air intake side, across one or more heat producing components of the computer system, and through at least one of the air outlets of the air exhaust side, and a power supply unit. The power supply unit includes a power supply enclosure enclosing at least one of the heat producing components, a power supply module in the enclosure, and one or more power supply air inlets. The power supply module supplies power to electrical components external to the enclosure. The power supply air inlets allow air into the power supply enclosure. At least one of the power supply air inlets is located on the air intake side of the computer system.

According to one embodiment, a rack-mountable computer system includes a chassis that is mountable in a rack, and a power supply unit coupled to the chassis. The power supply unit includes a power supply enclosure, a power supply module, and a fan. The power supply enclosure has a panel that faces outwardly from the chassis. The outwardly facing panel includes one or more openings for air. The fan pulls air through the openings in the panel and across one or more heat producing components of the power supply module.

According to one embodiment, a method of cooling components includes providing an air moving device for heat producing components of a rack-mounted computer system. Air is drawn from outside the rack-mounted computer system into a power supply enclosure for the power supply unit. The air is expelled from the power supply enclosure into an enclosure for the rack-mounted computer system. In certain embodiments, a standard power supply unit is modified to reverse a direction of air flow in the power supply unit.

According to one embodiment, a system includes a rack and one or more computer systems mounted in the rack. One or more rack power distribution units are coupled in the rack one or more sides of the rack. The rack power distribution units supply power to the computer systems in the rack. The rack power distribution units may be rotatable with respect to the rack to allow installation or removal of the computer systems on the side of the rack on which the rack power distribution units are mounted.

According to one embodiment, a system includes a rack, one or more computer systems mounted in the rack, one or more rack power distribution units, and one or more coupling devices. The coupling devices couple the rack power distribution units to the rack such that the rack power distribution unit is movable relative to the rack while the rack power distribution units remains installed on the rack to allow installation or removal of the computer systems on the side of the rack on which the rack power distribution units are mounted.

According to one embodiment, a coupling device for coupling a rack power distribution unit to a rack includes one or more brackets and one or more rack coupling portions. The brackets include one or more PDU coupling portions that couple with a rack power distribution unit. The rack coupling portions allow movement of the bracket relative to the rack.

According to one embodiment, a method of performing maintenance or reconfiguration on computer systems in a rack includes moving a rack power distribution unit from an operating position to a maintenance position while the rack power distribution unit remains coupled to the rack. When the rack power distribution unit is in the maintenance position, the rack power distribution unit is out of the installation/removal path for computer systems in the rack. A computer system is at least partially removed from or installed in the rack while the rack power distribution unit is in the maintenance position.

According to one embodiment, a computer system includes a chassis, one or more hard disk drives coupled to the chassis, and one or more air passages under at least one of the hard disk drives. The air passages include one or more air inlets and one or more air outlets. The inlets direct at least a portion of the air downwardly into the passages. The passages allow air to move from the air inlets to the air outlets.

According to one embodiment, a tray for holding one or more data storage devices includes one or more support portions that support the data storage devices and one or more spacing portions that establish one or more air passages below the data storage devices when the tray is installed in a computer system.

According to one embodiment, a method includes moving air into passages under hard disk drives of a computer system, allowing heat from heat producing components on the hard disk drives to transfer to air in the passages, and removing the air from the passages.

According to one embodiment, a system includes a rack, one or more computer systems mounted in the rack, and two or more alternating current (AC) fans mounted in the rack. The AC fans move air through the computer systems mounted in the rack. At least one of the AC fans can move air through at least two of the computer systems mounted in the rack According to one embodiment, a system includes a rack, one or more computer systems mounted in the rack, and one or more fans coupled to the rack at an angular orientation. The fans move air through the computer systems mounted in the rack. At least one of the fans can move air through at least two of the computer systems mounted in the rack.

According to one embodiment, a system for providing air flow through computer systems in a rack includes a mounting panel that mounts in the rack and one or more fan modules. The fan modules include a fan chassis and one or more fans. The mounting panel holds the fan modules at an angle with respect to the rack.

According to one embodiment, a method includes coupling AC fans to a rack such that the AC fans are in an angular orientation relative to the rack, and operating the AC fans to move air through computer systems in the rack.

As used herein, "air intake side" is a side of a system or element, such as a server, that can receive air into the system or element.

As used herein, "air exhaust side" is a side of a system or element, such as a server, that can exhaust, expel, or discharge air from the system or element.

As used herein, "air handling system" means a system that provides or moves air to, or removes air from, one or more systems or components.

As used herein, "air moving device" includes any device, element, system, or combination thereof that can move air. Examples of air moving devices include fans, blowers, and compressed air systems.

As used herein, an "aisle" means a space next to one or more racks.

As used herein, "ambient" means, with respect to a system or facility, the air surrounding at least a portion of the system or facility. For example, with respect to a data center, ambient air may be air outside the data center, for example, at or near an intake hood of an air handling system for the data center.

As used herein, a "cable" includes any cable, conduit, or line that carries one or more conductors and that is flexible over at least a portion of its length. A cable may include a connector portion, such as a plug, at one or more of its ends.

As used herein, "chassis" means a structure or element that supports another element or to which other elements can be mounted. A chassis may have any shape or construction, including a frame, a sheet, a plate, a box, a channel, or a combination thereof. A chassis for a computer system may support circuit board assemblies, power supply units, data storage devices, fans, cables, and other components of the computer system.

As used herein, "computing" includes any operations that can be performed by a computer, such as computation, data storage, data retrieval, or communications.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "coupling device" includes an element or combination of elements that can be used to couple one element or structure to one or more other elements or structures. Examples of a coupling device include a bracket, a linkage, a connecting rod, a hinge, a rail, or combination thereof.

As used herein, "data center" includes any facility or portion of a facility in which computer operations are carried out. A data center may include servers dedicated to specific functions or serving multiple functions. Examples of computer operations include information processing, communications, testing, simulations, power distribution and control, and operational control.

As used herein, "data center module" means a module that includes, or is suitable for housing and/or physically supporting, one or more computer systems that can provide computing resources for a data center.

As used herein, to "direct" air includes directing or channeling air, such as to a region or point in space. In various embodiments, air movement for directing air may be induced by creating a high pressure region, a low pressure region, or a combination both. For example, air may be directed downwardly within a chassis by creating a low pressure region at the bottom of the chassis. In some embodiments, air is directed using vanes, panels, plates, baffles, pipes or other structural elements.

As used herein, a "duct" includes any device, apparatus, element, or portion thereof, that can direct, segregate, or channel a fluid, such as air. Examples of ducts include cloth or fabric ducts, sheet metal ducts, molded ducts, tubes, or pipes. The cross sectional shape of a passageway of a duct may be square, rectangular, round or irregular, and may be uniform or change over the length of the duct. A duct may be a separately produced component or integral with one or more other components, such as a frame.

As used herein, a "module" is a component or a combination of components physically coupled to one another. A module may include functional elements and systems, such as computer systems, circuit boards, racks, blowers, ducts, and power distribution units, as well as structural elements, such a base, frame, housing, or container.

As used herein, a "pin" includes any element that can be positioned to constrain or hold another element in a desired position or orientation. Suitable pins may include straight pins, pegs, threaded bolts, unthreaded bolts, bars, plates, hooks, rods, or screws.

As used herein, "power distribution unit" means any device, module, component, or combination thereof, that can be used to distribute electrical power. The elements of a power distribution unit may be embodied within a single component or assembly (such as a transformer and a rack power distribution unit housed in a common enclosure), or may be distributed among two or more components or assemblies (such as a transformer and a rack power distribution unit each housed in separate enclosure, and associated cables, etc.).

As used herein, a "rack" means a rack, container, frame, or other element or combination of elements that can contain or physically support one or more computer systems.

As used herein, "rack power distribution unit" refers to a power distribution unit that can be used to distribute electrical power to various components in a rack. A rack power distribution unit may include various components and elements, including wiring, bus bars, connectors, and circuit breakers.

As used herein, "room" means a room or a space of a building. As used herein, "computer room" means a room of a building in which computer systems, such as rack-mounted servers, are operated.

As used herein, a "space" means a space, area or volume.

In some embodiments, electrical connections and intake air for rack-mounted computer systems are provided at a common end of the rack system. FIG. 1 illustrates one embodiment of a system that includes electrical connections and intake vents at the front end of a rack system. System 100 includes rack 102 and computer systems 104. Computer systems 104 are installed on front posts 106 and rear posts 108 of rack 102.

Each of computer systems 104 includes chassis 112, circuit board assembly 114, power supply unit 116, and hard disk drives 118. In some embodiments, circuit board assembly 114 is a motherboard for computer system 104. In certain embodiments, a power supply unit may supply power to two or more motherboard assemblies in a computer system. In some embodiments, each of computer systems 104 is 1 rack unit (1 U) high. In one embodiment, rack 102 is a 42 U rack.

At front 119 of computer system 104, computer system 104 includes input/output panel 120 and air vents 122. Power supply unit 116 includes power supply panel 132. Power supply panel 132 includes input power receptacle 134 and air vents 136.

Rack 102 includes base 140, posts 142, and top panel 144. Posts 142 include front hinge elements 146 and rear hinge elements 148. In some embodiments, rack 102 may include panels on any or all of the sides, front, and rear of the rack 102 (a right side panel of rack 102 has been partially omitted in FIG. 1 for clarity).

Rack 102 includes rear door 160. Rear door 160 is coupled to rack 102 on rear hinge elements 148. Rear door 160 includes fans 162. Fans 162 may be operated to provide air flow through computer systems 104. In one embodiment, fans 162 create a low pressure region inside rack 102 at the rear of computer systems 104. Air may be drawn from the front of rack 102 through computer systems 104 and exhausted out the rear of rack 102 through fans 162.

Rack 102 includes rack power distribution units 170. Rack power distribution units 170 are mounted on PDU brackets 172. PDU brackets 172 include hinges 174. PDU brackets 172 are coupled to rack posts 142 at front hinge elements 146. Rack power distribution units 170 include PDU output receptacles 176. Rack power distribution units 170 may supply power to computer systems 104. For each computer system 104, one of power cables 178 may couple one of output receptacles 176 in rack power distribution unit 170 with input receptacle 134 on power supply unit 116 of the computer system.

Power connectors for a power cable and the corresponding receptacles on a rack power distribution unit and power supply may be any of various connector types. In one embodiment, rack power distribution units 170 have IEC C13 receptacles and power supply units 116 have IEC C14 receptacles.

Rack power distribution unit 170 may have any suitable power characteristics. Examples of output voltages for rack power distribution unitl 170 include 100 volts, 110 volts, 208 volts, and 230 volts. In certain embodiments, each of receptacles in rack power distribution unit 170 is on one phase of three-phase input power to the rack power distribution unit.

Computer systems 104 may be rack-mountable in rack 102. For example, rails may be installed on the left and right sides of chassis 104 to engage on corresponding rails, slides, or ledges, on left and right sides of a rack. In certain embodiments, a rail kit may be installed on the sides of the chassis for the computer systems.

Although only four of computer systems 104 are shown installed in rack 102 in FIG. 1 for clarity, a rack system may in various embodiments have any number of computer systems. For example, rack 102 may hold a computer system in each 1 U position in rack 102. In one embodiment, a rack system has about 20 1 U computer systems.

Figure 2:
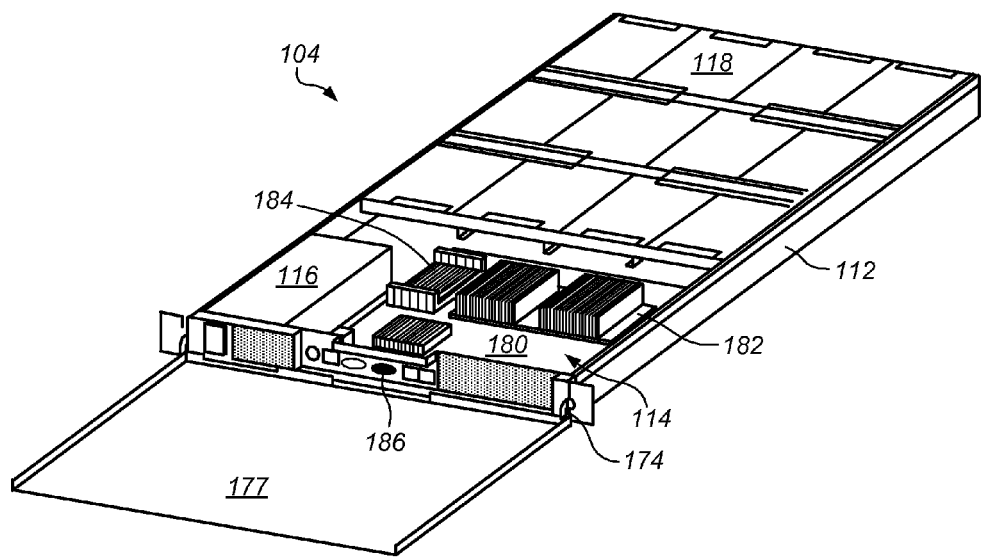
FIG. 2 illustrates one embodiment of a computer system that may be mounted in a rack.

FIG. 2 illustrates one embodiment of a computer system that can be mounted in a rack. Computer system 104 includes top cover 177. Top cover 177 may be pivotally connected to chassis 112 at top cover hinges 179. In FIG. 2, top cover 177 has been flipped away from its closed position on top cover hinges 179 to expose internal components of computer system 104.

Circuit board assembly 114 includes circuit board 180, processors 182, DIMM slots 184, and I/O connectors 186. Circuit board assembly 114 may include various other semiconductor devices, resistors, and other heat producing components. Circuit board assembly 114, along with other components in chassis 112 (hard disk drives, power supplies) and/or components external to chassis 112, may operate in conjunction with one another as a computer system. For example, computer system 100 may be a file server.

In the embodiment shown in FIG. 2, computer system 104 includes one power supply unit and 12 hard disk drives. A computer system may, however, have any number of hard disk drives, power supply units, or other components. In certain embodiments, a computer system may have one or more internal fans to promote the flow of air through a computer system. For example, in certain embodiments, a row of fans may be provided along the rear edge of computer system 104. In certain embodiments, a computer system may have no fans and/or no disk drives. In certain embodiments, a power supply may be external to a computer system. For example, in certain embodiments, circuit board assembly 114 may receive power from a power supply external to computer system 104 (such as a rack-level power supply), and power supply 130 may be omitted.

Heat sinks 189 are mounted on processors 142. Heat sinks 189 may transfer heat from processors 142 to air inside chassis 112 during operation of computer system 100. DIMMs (not shown for clarity) may be installed in any or all of DIMM slots 184.

When top cover 177 is in a service position (for example, flipped out over the front panel of computer system 104, such as shown in FIG. 2), top cover 177 may serve as a working tray. The working tray may be used during maintenance operations. For example, maintenance personnel may rest components such as hard disk drives, cables, and circuit board assemblies on top cover 177. In some embodiments, top cover may include structural reinforcement, such as ribs, to increase the amount and weight of materials that can be rested on top cover 177. In certain embodiments, top cover 177 includes texturing or non-slip surface elements or treatments to help keep working materials such as cables in place during maintenance.

When computer system 104 is to be reinstalled in rack 102, top cover 177 may be flipped back into a closed position on computer system 104. In some embodiments, top cover 177 includes a latch to secure the top cover in a closed position on computer system 104.

In some embodiments, a rack system is arranged so that air is received into computer systems in a rack on the same side of the rack as the input/output connections and power connections for the computer systems. In one embodiment, one portion of air may flow into inlets in a chassis for a computer system and another portion of the air may flow into a power supply unit for the computer system.

Figure 3:
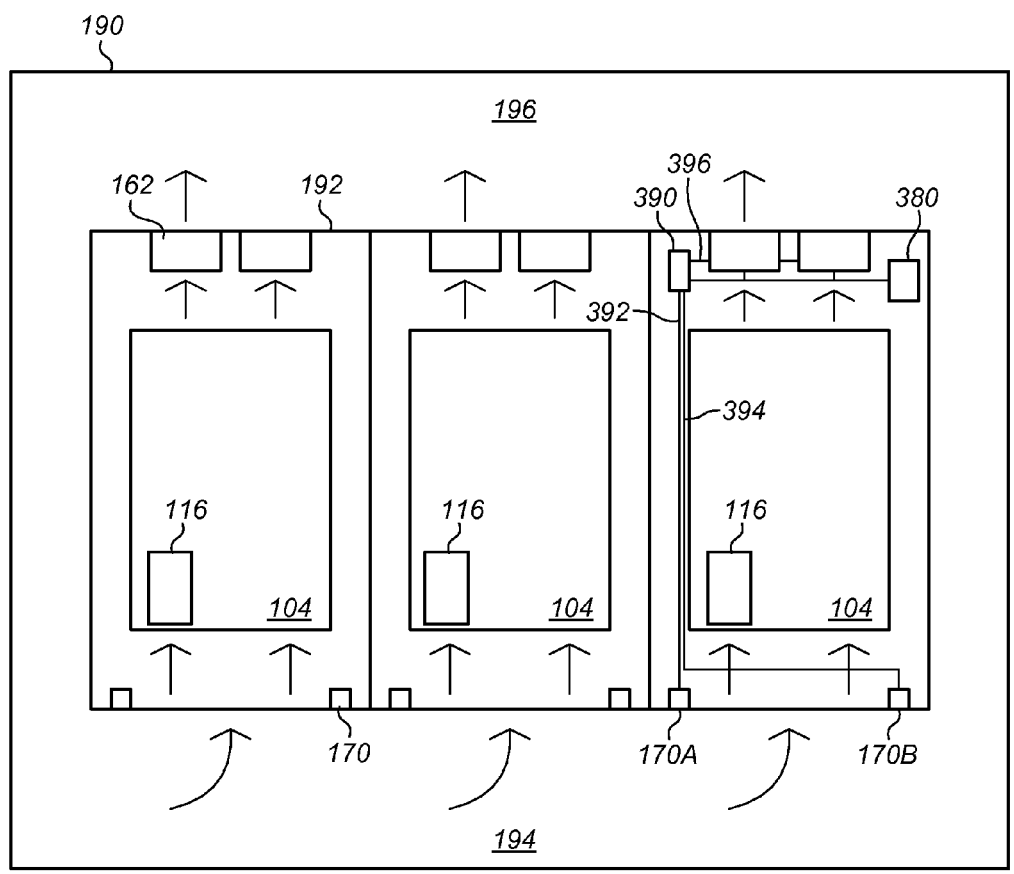
FIG. 3 illustrates one embodiment of a data center having power and data connections on a cold-aisle side of a row of racks.

In certain embodiments, all of the connections for a server are located on a cold aisle for the rack system. Locating all of the connections on a cold aisle may allow maintenance personnel to avoid having to perform any operations in a hot aisle. FIG. 3 illustrates one embodiment of a data center having power and data connections on a cold-aisle side of a row of racks. Data center 190 includes row of racks 192, cold aisle 194, and hot aisle 196. Row 192 includes racks 102 and computer systems 104. Each of racks 102 includes rack power distribution units 170 and fans 162. Cold aisle 194 may provide a supply of air for cooling computer systems 104 in racks 102. Fans 162 may draw air from cold aisle 194 into racks 102 and through computer systems 104, and then exhaust air from the computer systems into hot aisle 196. In one embodiment, air entering the servers from the cold aisle may be at about 35 degrees Celsius. In one embodiment, air exhausted from the servers into the hot aisle may be at about 50 to 55 degrees Celsius.

Figure 4:
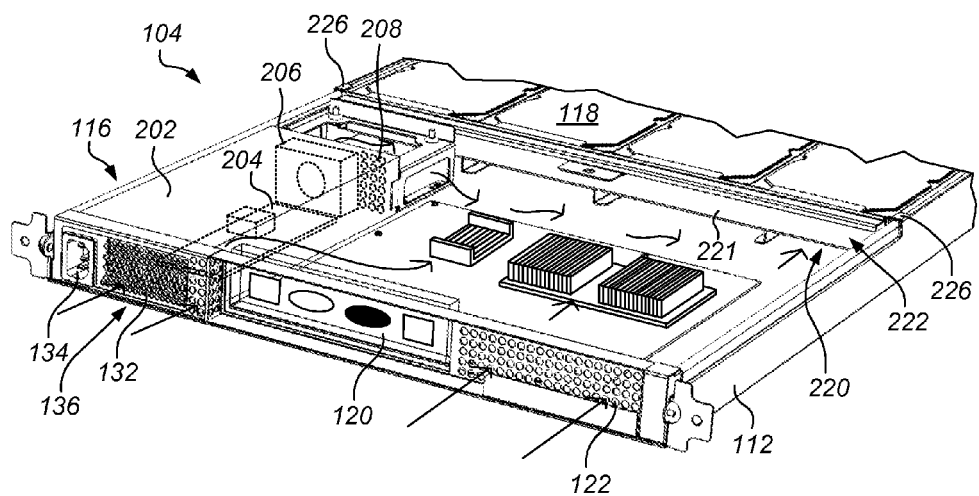
FIG. 4 illustrates air flow through one embodiment of a computer system.

FIG. 4 illustrates air flow through a computer system in one embodiment. Power supply unit 116 of computer system 104 includes power supply enclosure 202, power supply circuit board assembly 204, fan 206, and air vents 208. Power supply circuit board assembly 204 may receive power from input power receptacle 134 and supply power to electrical components in computer system 104. Fan 206 may move air through power supply enclosure 202 and across heat producing components on power supply circuit board assembly 204.

In some embodiments, air is drawn into a power supply unit enclosure from outside the computer system and expelled into a chassis of the computer system. For example, as illustrated in FIG. 4, fan 206 may draw air from outside computer system 104 into power supply enclosure 202 through air vents 136, across power supply circuit board assembly, and expel the air through air vents 208 into the inside of chassis 112 of computer system 104.

In various embodiments, a computer system includes a power supply that conforms to an industry-recognized standard. In some embodiments, a power supply for a computer system has a form factor in accordance with an industry-recognized standard. In one embodiment, a power supply unit has a standard 1 U form factor. Examples of other standards for a power supply and/or a power supply form factor include 2 U, 3 U, SFX, ATX, NLX, LPX, or WTX.

In some embodiments, a standard power supply is modified to reverse the airflow for the power supply unit. For example, in the off-the-shelf configuration of a standard 1 U power supply with the form factor shown in FIG. 4, fan 206 may pull air into power supply enclosure 202 through air vents 208 and expel air out of power supply enclosure through air vents 136 (that is, pull air from inside the computer system and expel air to the outside at the front panel of the server). In some embodiments, air flow in the standard power supply may be reversed such that fan 206 pulls air into power supply enclosure 202 through air vents 136 and out of power supply enclosure 202 through air vents 208 (which results in the air flow being from outside the computer system to inside). In one embodiment, reversing the air flow is accomplished by reversing the wiring of the fan from the off-the-shelf configuration. In another embodiment, reversing the air flow is accomplished by flipping the orientation of the fan such that so that air flows in the opposite direction from that of the off-the-shelf configuration.

In some embodiments, input and output power specifications for a power routing device may conform to an industry standard. In one embodiment, the voltages and functions conform to an ATX standard. In various other embodiments, the output from a power routing device may conform to other standards, such as Entry-Level Power Supply Specification, or EPS12V.

In some embodiments, an input power receptacle and an air intake for a power supply are located at a common end of a computer system. For example, in the embodiment illustrated in FIG. 4, input power receptacle 134 and air vents 136 are located on power supply panel 132. Power supply unit 116 is oriented in chassis 112 such that power supply panel 132 aligns with the input/output panel 120 at front 119 of computer system 104.

Hard disk drives 118 are mounted on tray 222. Air exiting power supply enclosure 202 may flow toward the rear of computer system 104 through channels 220 under hard disk drives 118. Air passing over circuit board assembly 114 may also flow toward the rear of computer system 104 through channels 220 under hard disk drives 118. Air flowing through channels 220 under hard disk drives 118 may remove heat from heat producing components in hard disk drives 118, such as control components and electrical motors. Air may exit from the rear of computer system 104. Tray 222 includes rim 221. In some embodiments, rim 221 may block all or a portion of the air in a chassis from passing over hard disk drives 118. In certain embodiments, cases of the hard disk drives may block all or a portion of the air in the chassis from passing over the hard disk drives. By blocking air from passing over the hard disk drives, rim 221 may redirect the air to flow through channels 220 under hard disk drives 118.

FIG. 5 illustrates a rear view of computer system 104. Tray 222 for hard disk drives 118 and side panels 223 and bottom panel 224 of chassis 112 define openings 225 at rear 226 of computer system 104. Air flowing under hard disk drives 118 may exit computer system through openings 225. Tray 222 may be held under upper tabs 226 of on chassis 112. Tray 222 may be secured at the rear of tray 222 by way of screws 227. Screws 227 may pass through holes in tray and thread into rear tabs 228 of chassis 112.

In some embodiments, removing air downstream from of a circuit board assembly at the bottom of a computer system enclosure may enhance air flow over the circuit board assembly. FIG. 6 illustrates a schematic side view of air flow through a computer system according to one embodiment. Air may flow over circuit board assembly 114 to the rear of the circuit board assembly 114, where the air is drawn under hard disk drives 118. Removing air downstream passing over a circuit board assembly near the bottom of a chassis, such through channels 220 under hard disk drives 118, may enhance airflow across circuit board assembly 114 by increasing the velocity of the air flow at the surface of circuit board assembly 114 and/or increasing turbulence of air at or near the circuit board.

Figure 7:
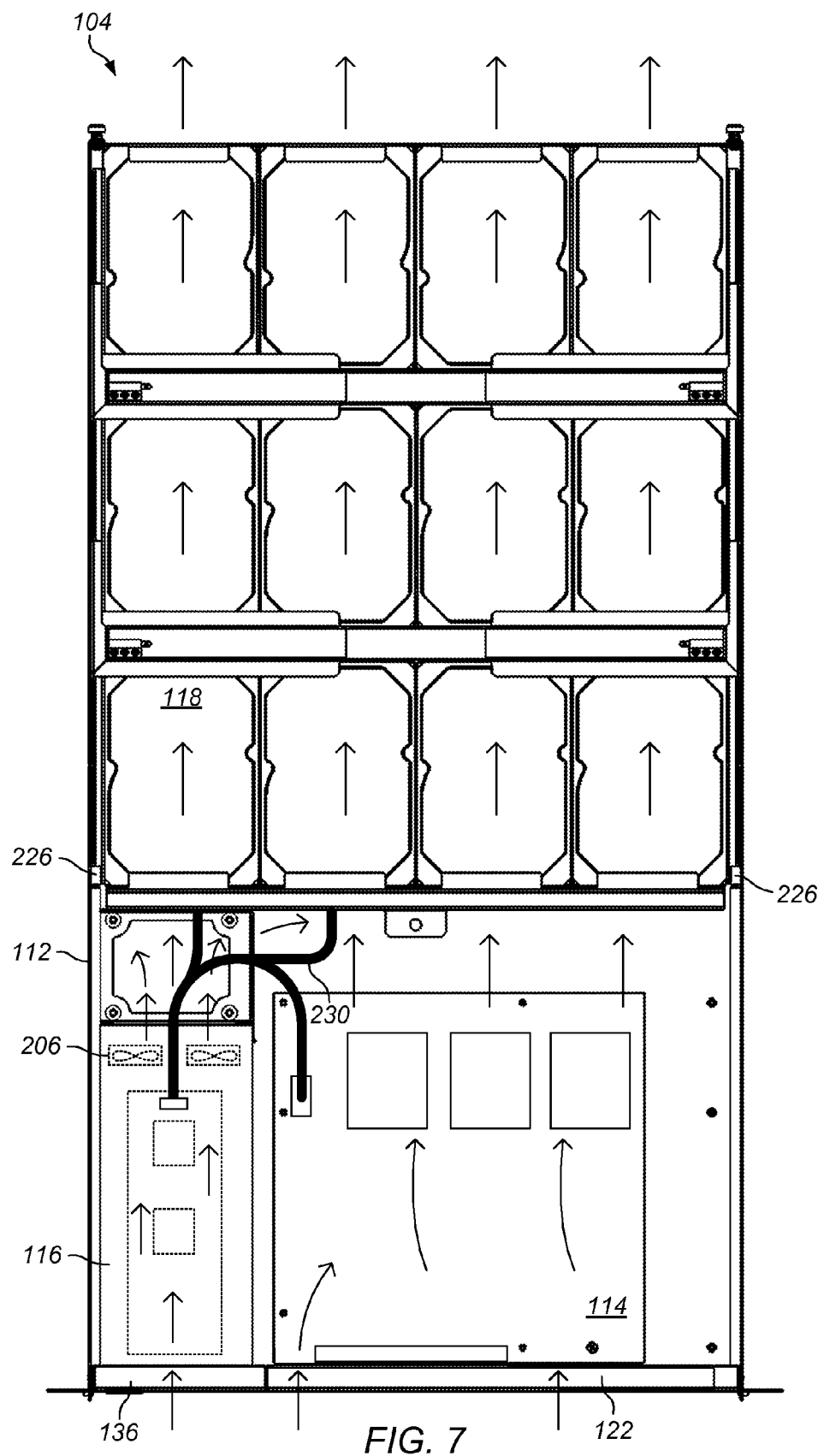
FIG. 7 is a schematic top view illustrating air flow through a computer system according to one embodiment.

In some embodiments, air leaving exiting a power supply unit may mix with air used to cool other heat producing components in a computer system enclosure, such as a central processing unit. FIG. 7 is a schematic top view illustrating air flow through a computer system in one embodiment. One portion of air may enter power supply unit 116 through air vents 136 and be expelled into chassis 112 of computer system 104 through air vents 208. A second portion of air may enter computer system 104 through air vents 122 and pass over circuit board assembly 114. The air passing through power supply unit 116 and over circuit board assembly 114 may mix downstream of the power supply and the circuit board assembly. Mixing of air from power supply unit 116 and circuit board assembly may result in more uniform temperatures of air flowing across downstream components, such as hard disk drives 118. For example, relatively hot air from power supply unit 116 may mix with relatively cool air near the rear of circuit board assembly 114. In some embodiments, power cable 230 for power supply unit 116 may serve as a diffuser for air exiting power supply unit 116. In certain embodiments, a computer system may include dedicated elements for mixing air, such as vanes. For example, vanes may be provided on the bottom of chassis 112 of computer system 104.

In the embodiments described above, air exhausted from the power supply unit mixes with air from other components of the computer system. In other embodiments, however, air from a power supply may be segregated from other air inside a computer system enclosure. For example, in one embodiment, air exiting from power supply unit 116 may be segregated from other air in chassis 114 and moved to the rear of computer system 104 in a separate duct. In certain embodiments, a computer system may include a barrier between the air exiting a power supply unit and other air inside a computer system enclosure. In some embodiments, a computer system may include a dedicated fan for cooling of a power supply unit. A dedicated fan may be used to increase air flow over heat producing components in the power supply unit.

In some embodiments, one or more rack power distribution units are provided at the air intake side of a rack. The rack power distribution units may be at the same end of the rack as the connections for power supplies for servers in the rack. Referring again to FIG. 1, system 100 includes rack power distribution units 170 on the left and right sides of rack 102 at the front of rack 102.

Figure 8:
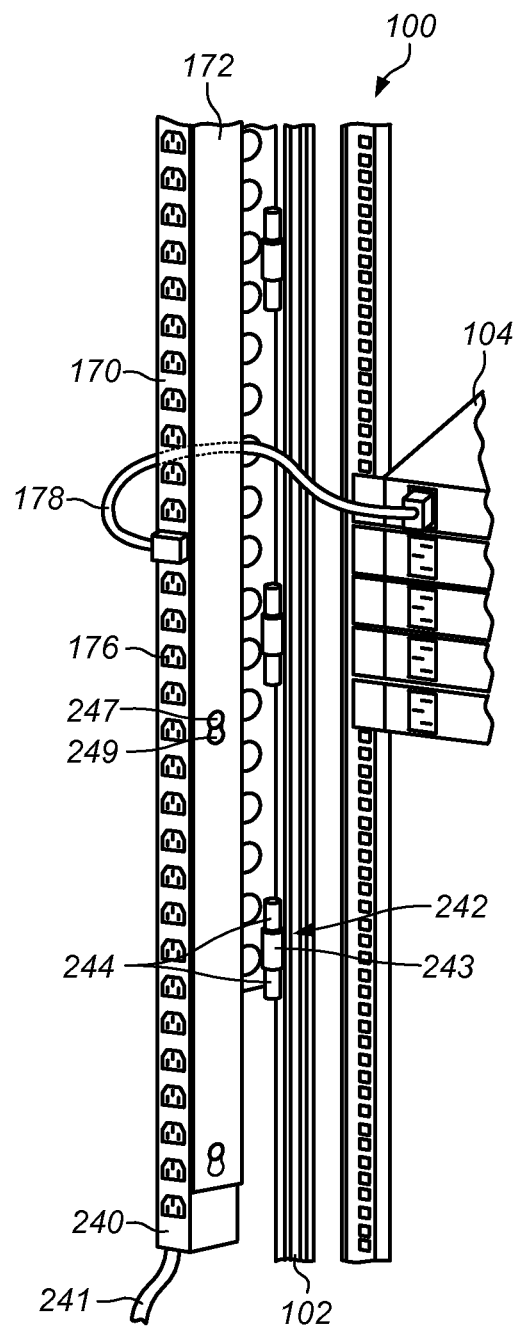
FIG. 8 illustrates one embodiment of a rack power distribution unit on a coupling device that allows for movement of the rack power distribution unit.

In some embodiments, rack power distribution units are attached to a rack by way of a coupling device. In some embodiments, a coupling device allows for movement or repositioning of the rack power distribution unit, for example, during maintenance operations. FIG. 8 illustrates one embodiment of a rack power distribution unit on a coupling device that allows for movement of the rack power distribution unit.

Rack power distribution unit 170 includes rack PDU enclosure 240. Rack power distribution unit 170 is mounted on bracket 172. Bracket 172 may serve as coupling device for rack power distribution unit 170. Bracket 172 is coupled to rack 102 by way of hinges 242. Rack power distribution unit 170 may be coupled to bracket 172 by engagement of buttons 247 in keyhole slots 249.

Each of hinges 242 include hinge element 243 and hinge element 244. Hinge elements 244 may be on the rack side of the hinge 242. Hinge element 243 may be on the bracket side of hinge 242. Hinge elements 243 and hinge elements 244 may cooperate to form a hinges 242 between bracket 172 and rack 102. Rack power distribution unit 170 may rotate on hinges 242.

In some embodiments, hinge elements 244 may be part of a standard, off-the shelf rack. The locations and dimensions of hinge element 243 of bracket 172 may be chosen to match the locations and dimensions of hinge elements 243 of the standard, off-the shelf rack. In certain embodiments, a door may be removed from a standard, off-the-shelf rack and replaced with one or more hinge-mounted rack power distribution units, such as shown above relative to FIG. 8.

In some embodiments, a bracket for mounting a rack power distribution unit may be reversible such that the same bracket can be used on either side of rack. For example, bracket 172 may be reversible such that bracket 172 can be used to couple rack power distribution units 170 on both sides of rack 102.

In certain embodiments, hinge element 243 may be formed from sheet metal as an integral part of bracket 172. In other embodiments, hinge element 243 may be produced as a separate part and then attached to bracket 172, for example, by rivets, screws, or welding.

Rack power distribution unit 170 may include any number of receptacles. For example, with reference to FIG. 1, each of rack power distribution units 170 on the left and right sides of rack 102 may includes 21 receptacles. Rack power distribution unit 170 may receive input power through cable 241. Each of receptacles 176 in rack power distribution unit 170 may be coupled to a different computer system 104 in rack 102 by way of one of power cables 178 (in FIG. 8, power cable 178 is shown for only one such connection for clarity).

Figure 9:
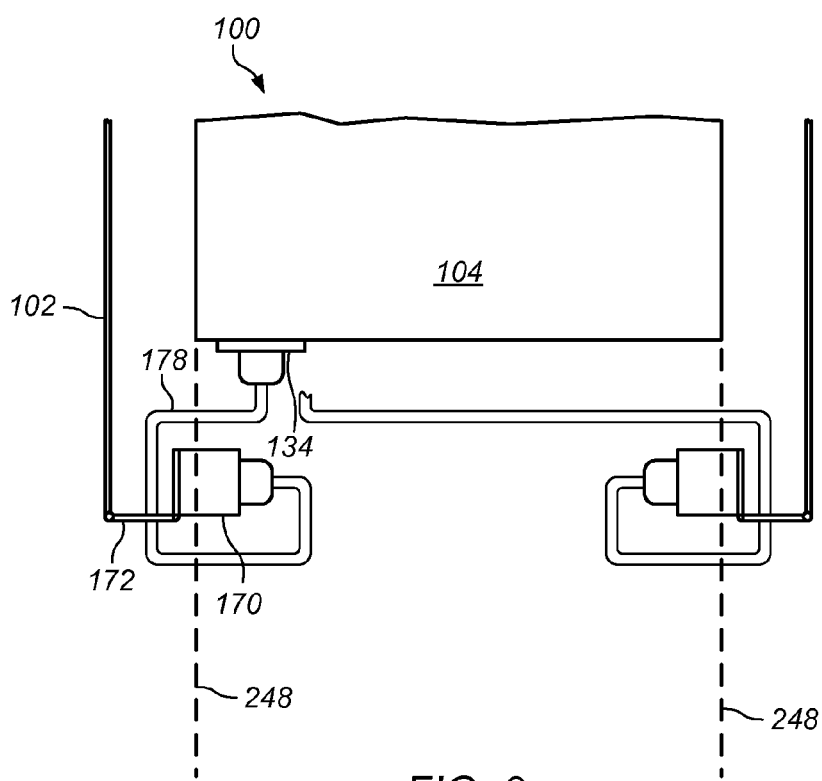
FIG. 9 is a top view schematic illustrating one embodiment of a rack system with rack power distribution units in a normal position.
Figure 10:
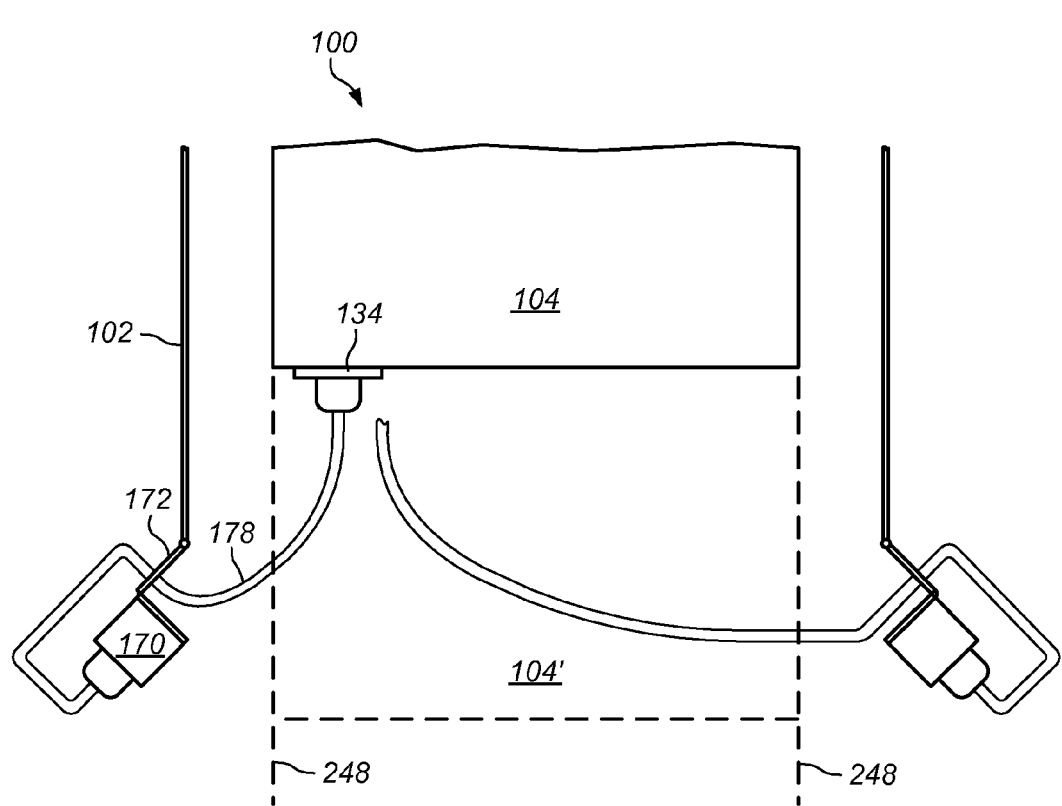
FIG. 10 is a top view schematic illustrating one embodiment of a rack system with rack power distribution units in a maintenance position.

FIG. 9 is a top view schematic illustrating one embodiment of a rack system with rack power distribution units in a normal position. FIG. 10 is a top view schematic illustrating one embodiment of a rack system with rack power distribution units in a maintenance position. System 100 includes rack 102, computer systems 104, and rack power distribution units 170. Rack power distribution units 170 are coupled to rack 102 by way of brackets 172. When rack power distribution units 170 are in a normal position (as shown, for example, in FIG. 9), rack power distribution units 170 and/or brackets 172 may be in installation/removal path 248 of computer systems 102. Rack power distribution units 170 may be repositioned to a maintenance position (as shown, for example, in FIG. 10). As rack power distribution units 170 are rotated with respect to rack 102 on brackets 172, power cables 178 may uncoil relative to the rotation axis of the hinge. Uncoiling and/or unwinding of power cables 178 may reduce or eliminate tension in power cable 178 as the receptacles on rack power distribution unit 170 are swung away from computer systems 104.

With rack power distribution units 170 in a maintenance position, any of computer systems 104 in rack 102 may be installed or removed from rack 104. For example, computer system 104' may be slid out of rack 102 while rack power distribution units 170 are in the maintenance position.

In some embodiments, rack power distribution units are provided on both ends of a rack. The rack power distribution units may be movable with respect to the rack to facilitate access to servers in the rack.

Figure 11:
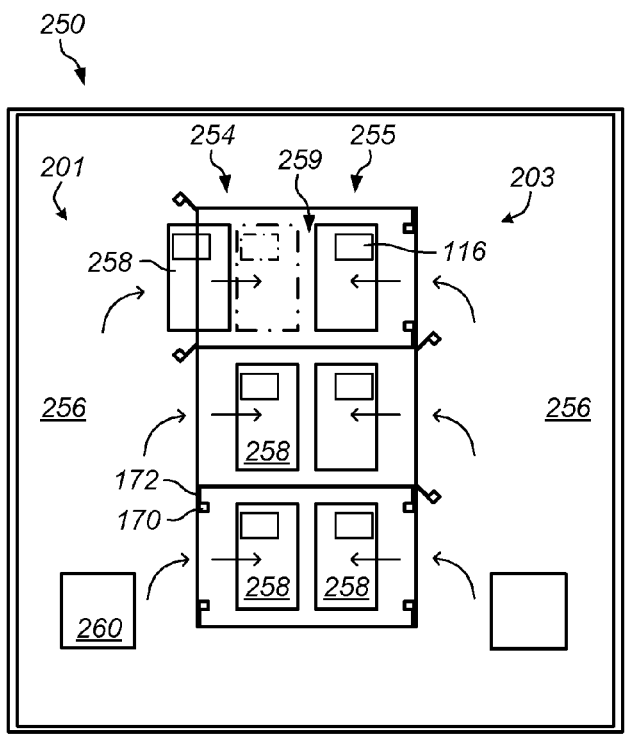
FIG. 11 illustrates a schematic top view illustrating one embodiment of a data center having a row of server cold-cold rack systems with rack power distribution units on both ends of the racks.
Figure 12:
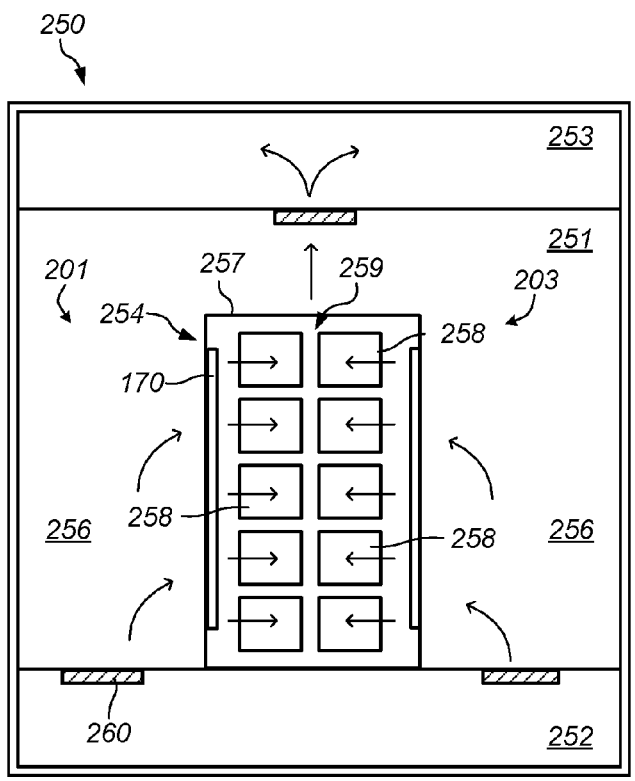
FIG. 12 illustrates a schematic end view illustrating one embodiment of a data center having a row of server cold-cold rack systems with rack power distribution units on both ends of the racks.

In some embodiments, movable rack power distribution units are provided on both ends of a cold-cold rack system. FIG. 11 illustrates a schematic top view of one embodiment of a data center having a row of cold-cold rack systems with rack power distribution units on both ends of the rack. FIG. 12 illustrates a schematic end view of the data center shown in FIG. 11. Data center 250 includes computer room 251, subfloor chamber 252, and plenum 253. Computer room 251 includes cold-cold rack systems 254 in common row 255. In one embodiment, cold-cold rack system 254 is a half-depth server made by Rackable Systems, Inc. Row 255 separates cold aisles 256.

Each cold-cold rack system 254 includes rack 257 and half depth servers 258. Servers 258 may be any height, including 1 U, 2 U, or 3 U. In each cold-cold rack system 254, mid column 259 is provided or formed in the space between the front stack of half depth servers 258 and the back stack of half depth servers 258. Servers 258 in cold-cold rack systems 254 are cooled by drawing air into rack system 254 on both the front and back of the rack system, and removing the air from mid column 259 through the top of racks 257.

To remove heat from servers 258, an air handling system may be operated to cause air to flow from subfloor 252 to computer room 251 through aisle floor vents 260. Air from aisle floor vents 260 may pass from cold aisles 256 into cold-cold rack systems 254. In one embodiment, the flow of air in the racks is about 450 cubic feet per minute per rack, per side. Air flows from the front side and back side of rack systems 254 through half depth servers 258 to mid column 259. Air in mid column 279 passes out through the tops of racks 257.

Cold-cold rack systems 254 include rack power distribution units 170 on front side 201 and back side 203 of rack 102. Rack power distribution units 170 are coupled to racks 102 of cold-cold rack systems 254 on brackets 172. Rack power distribution units 170 and brackets 172 may be similar to those described above relative to FIG. 8. Brackets 172 may provide a hinged connection between rack power distribution units 170 and rack 102. Rack power distribution units 170 may be rotated (for example, by maintenance personnel) to provide access to servers 258.

Air from cold aisles 256 may pass across rack power distribution units 170 before passing through servers 258. Cool air circulation in the area of rack power distribution units 170 may reduce a risk of failure of power distribution units 170 (for example, failure due to overheating of breakers in the rack power distribution units).

Figure 13:
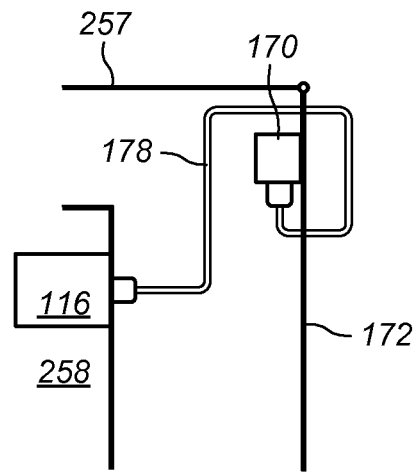
FIG. 13 is a top view schematic illustrating a power connection for a rack system with a rack power distribution unit in a closed position.
Figure 14:
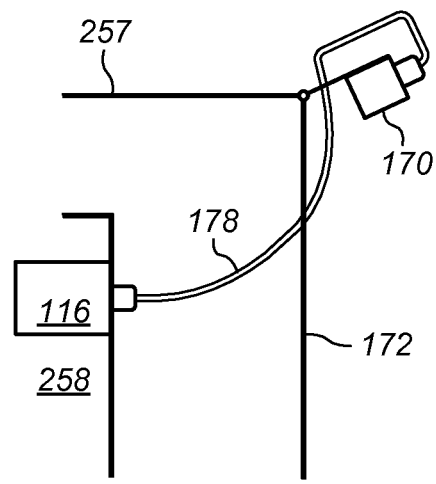
FIG. 14 is a top view schematic illustrating a power connection for a rack system with a rack power distribution unit in an open position.

Power cables (not shown in FIGS. 11 and 12 for clarity) may connect input power receptacles on power supply units 116 in servers 258 to power output receptacles in rack power distribution units 170. FIG. 13 is a top view schematic illustrating a power connection for one of rack systems 254 with rack power distribution unit 170 in a closed position. FIG. 14 is a top view schematic illustrating a power connection for one of rack systems 254 with rack power distribution unit 170 in an open position. When rack power distribution unit 170 is in an open position, any of the servers in rack system 254 may be removed from rack system 254 (as illustrated in FIG. 11).

Figure 15:
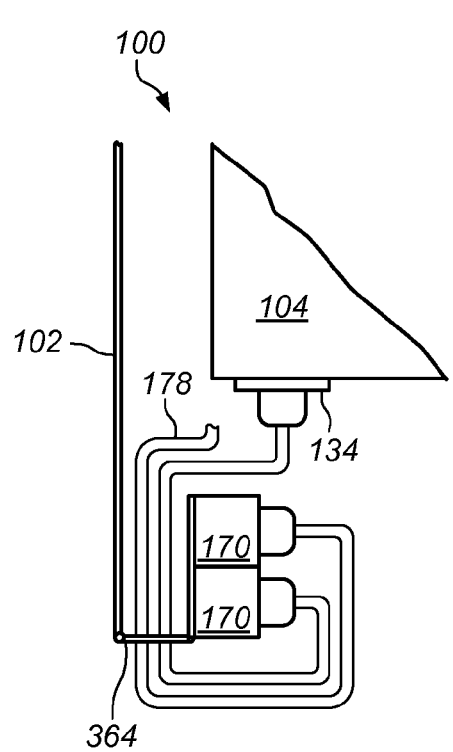
FIG. 15 illustrates an embodiment of a rack system with two power distribution units on a single bracket.

FIG. 15 illustrates an embodiment of a rack system with two power distribution units on a single bracket. Two rack power distribution units 170 are coupled to bracket 264. Bracket 264 is coupled to rack 102. Each of power distribution rack power distribution units 170 may include a series of power receptacles. In one embodiment, each of rack power distribution units 170 includes 21 receptacles.

Figure 16:
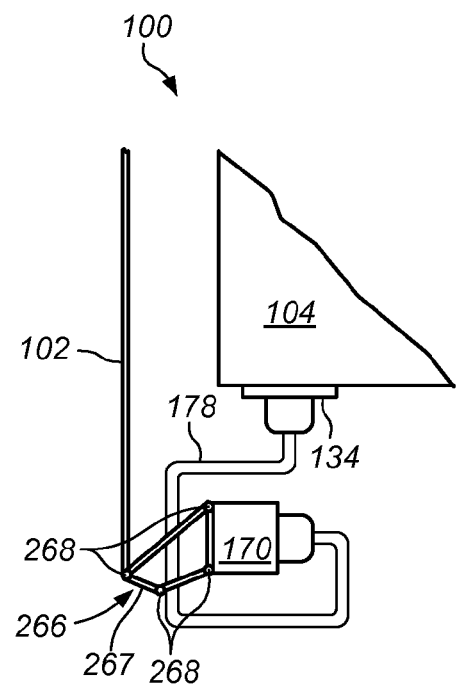
FIG. 16 is a schematic view illustrating an embodiment of a rack system including a rack power distribution unit coupled to a rack by way of a linkage.

In the embodiments shown in FIG. 8-10, bracket 172 couples a rack power distribution unit for rotational motion relative to a rack about hinge 242. A coupling device may, however, couple a rack power distribution unit for other types of motion relative to a rack. FIG. 16 is a schematic view illustrating an embodiment of a rack system including a rack power distribution unit coupled to a rack by way of a linkage. Rack system 100 includes linkage 266. Linkage 266 couples rack power distribution unit 170 to rack 102. Linkage 266 includes links 267 and hinges 268. Rack power distribution unit 170 may be repositioned on linkage 266 to provide access to computer systems 104.

Figure 17:
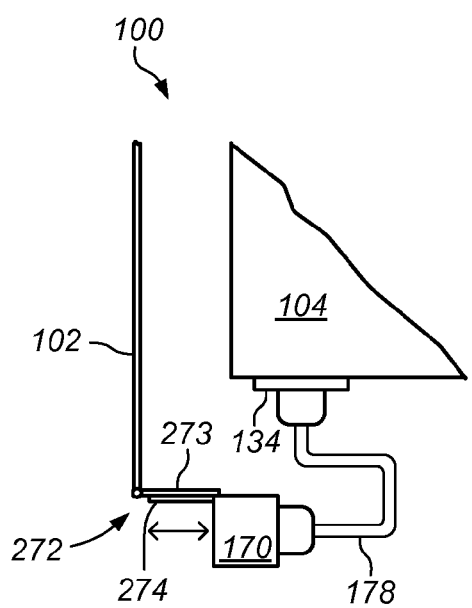
FIG. 17 is a schematic view illustrating an embodiment of a rack system including a rack power distribution unit in a sliding arrangement.

In certain embodiments, a rack power distribution unit may be coupled for translation relative to a rack. FIG. 17 is a schematic view illustrating an embodiment of a rack system including a rack power distribution unit in a sliding arrangement. Rack system 100 includes slide coupling 272. Slide coupling includes plate 273 and rail 274. Rack power distribution unit 170 may couple on rail 274. Rack power distribution unit 170 may be slid on rail 274 in the direction of the arrows to provide access to computer systems 104.

Figure 18:
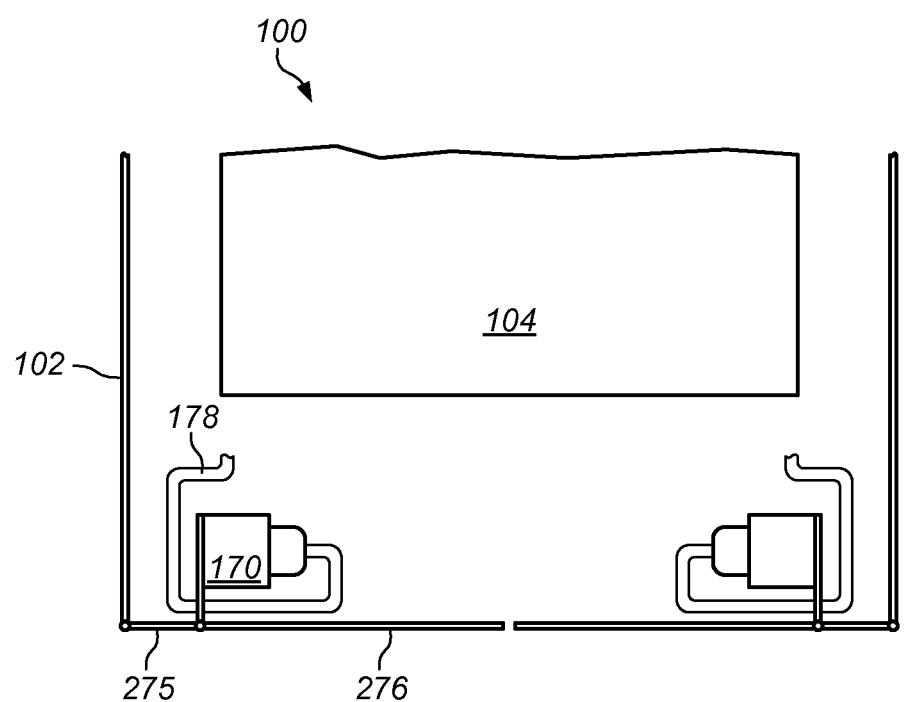
FIG. 18 illustrates an embodiment of a rack system that includes front rack power distribution units and rack doors.

FIG. 18 illustrates an embodiment of a rack system that includes front rack power distribution units and rack doors. Rack power distribution unit 170 is coupled to rack 102 by way of bracket 275. In some embodiments, bracket 275 in connected to rack 102 by way of one or more hinges. Doors 276 may couple to bracket 276. In certain embodiments, bracket 275 may use hinge elements on a standard, off-the-shelf rack. In certain embodiments, brackets 275 and doors 276 may replace standard rack doors of an off-the-shelf rack.

Figure 19:
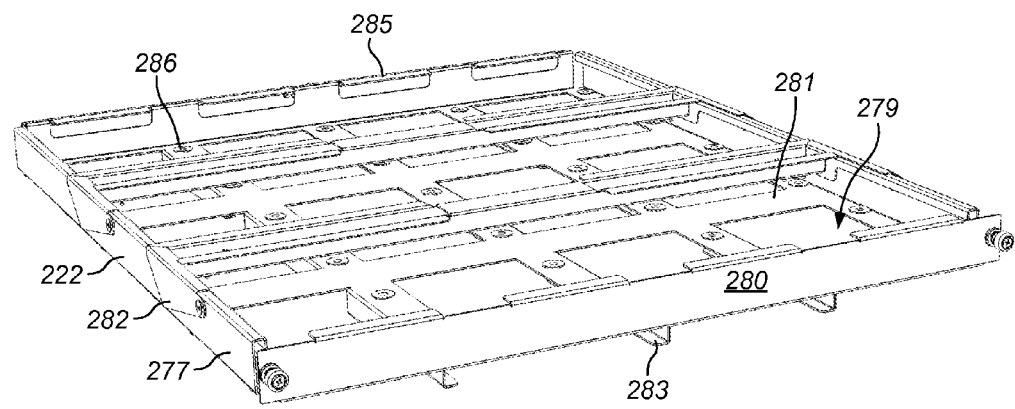
FIG. 19 illustrates one embodiment of a tray for hard disk drives in a computer system.

FIG. 19 illustrates one embodiment of a tray for hard disk drives in a computer system. Tray 222 includes base 280 and clamping bars 282. Clamping bars 282 may hold hard disk drives 118 (not shown in FIG. 19 for clarity) in position on base 280.

Base 280 of tray 222 includes hard disk support plate 281, risers 283, and peripheral frame 277. Risers 283 may space hard disk drives from the bottom of a chassis of a computer system (such as chassis 112). Air passages 220 may be defined between risers 283 when tray 222 is installed in the chassis.

Support plate 281 includes openings 279. Openings 281 may promote the transfer of heat from heat producing components in hard disk drives to air moving through air passages 220. In certain embodiments, heat sinks may be provided on the underside of hard disk drives to promote heat transfer to air passages 220. In some embodiments, heat sinks are provided on tray 222. In other embodiments, heat sinks may be attached to the hard disk drives in the tray.

Tray 222 includes pads 286 on base 280. Pads 286 may protect hard disk drives 118 from vibration and/or shock loads. In one embodiment, pads 286 are made of a polymeric material.

In some embodiments, the spacing elements and disk drive support elements of a tray may be integral to one another. In the embodiment illustrated in FIG. 19, for example, support plate 281, risers 283, and peripheral frame 284 may be all formed as one piece. In one embodiment, support plate 281 and risers 283 are integrally formed from sheet metal. In other embodiments, support plate 281 and risers 283 are separate parts, which may be coupled to one another by fasteners, welds, adhesive or other manner. In various embodiments, the supporting portions and/or spacing portions of a tray may include rails, tubes, rods, bars, or any other structural elements.

Figure 20:
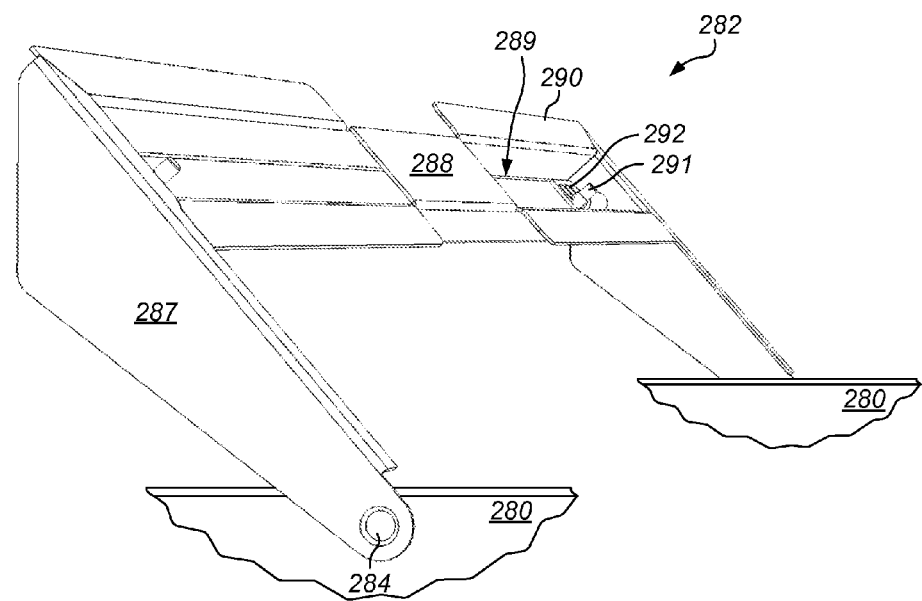
FIG. 20 illustrates one embodiment of a clamping bar in a raised position from the base of a tray.

FIG. 20 illustrates one embodiment of a clamping bar in a raised position from the base of a tray. Clamping bar 282 may be pivotally coupled to base 280 by way of pins 284. Clamping bar 282 includes arms 287 and cross member 288. Cross member 288 includes channels 289 and wings 290. Channels 289 and wings 290 may combine to form an inverse hat section on each side of cross member 288. Wings 290 may engage the edges of hard disk drives to hold the hard disk drives in tray 222.

Figure 21:
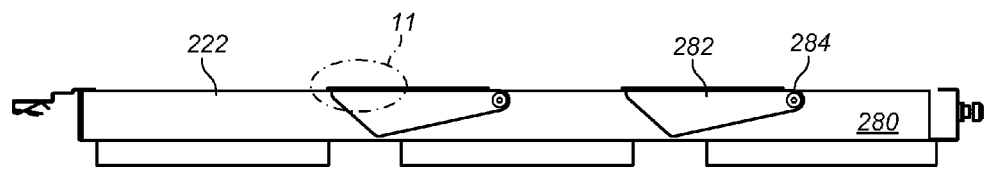
FIG. 21 illustrates a side view of one embodiment of a tray for hard disk drives.

FIG. 21 illustrates a side view of one embodiment of a tray for hard disk drives. In FIG. 21, locking bars 282 are in a closed position on base 280 (hard disk drives have been omitted for clarity).

Figure 22:
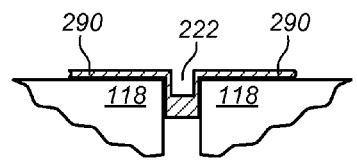
FIG. 22 illustrates a cross section of locking bar on adjacent disk drives.

FIG. 22 illustrates a cross section of locking bar on adjacent disk drives. Each of wings 290 of clamping bar 282 may contact a top surface of one of hard disk drives 118. Contact between wings 290 of clamping bar 282 and the top surfaces of the hard disk drives may retain the hard disk drives in tray 222. For some of hard disk drives 118, one edge of the hard disk drive is retained by one of tabs 285 on a frame of tray 222, and the opposite edge of the hard disk drive is retained by one of wings 290, as shown in FIG. 4.

In some embodiments, clamping bar 282 may be resiliently biased such that wings 290 bear down on the hard disk drives. For example, in certain embodiments, tray 222 may include torsion spring at the pivotal connection between clamping bar 282 and base 280. The torsion spring may resiliently bias clamping bars 282 into contact with hard disk drives 118.

In another embodiment, torsion springs may resiliently bias clamping bars away from base 280 (for example, to facilitate removal of the hard disk drives).

Figure 23:
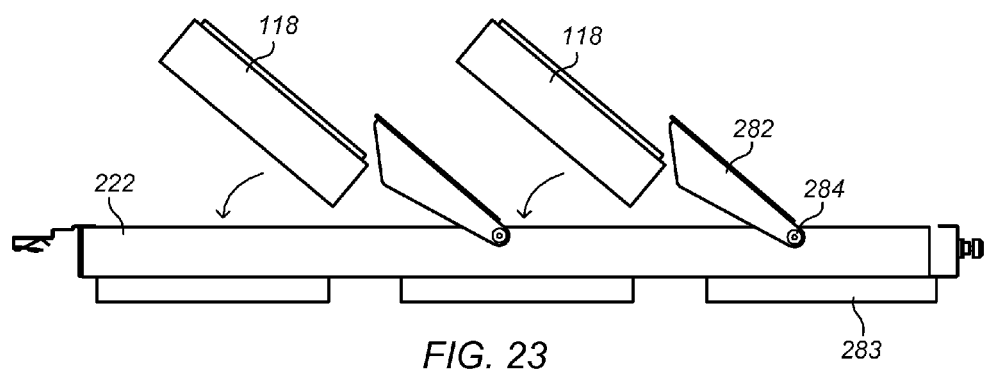
FIG. 23 illustrates a tray with clamping bars in an open position to allow removal of hard disk drives from the tray.

FIG. 23 illustrates a tray with clamping bars in an open position to allow removal of hard disk drives from the tray. Clamping bars 282 may be raised to allow installation or removal of hard disk drives 118.

In some embodiments, elements for holding down disk drives can be used as carrying handles for the hard disk drives, or as carrying handles for a computer system in which the tray is mounted. For example, clamping bars 282 may be grasped by a user to carry hard disk drives 118. In some embodiments, tray 222 is tool-less such that no tools are required to install tray 222 or to install or remove hard disk drives from the tray.

Figure 24:
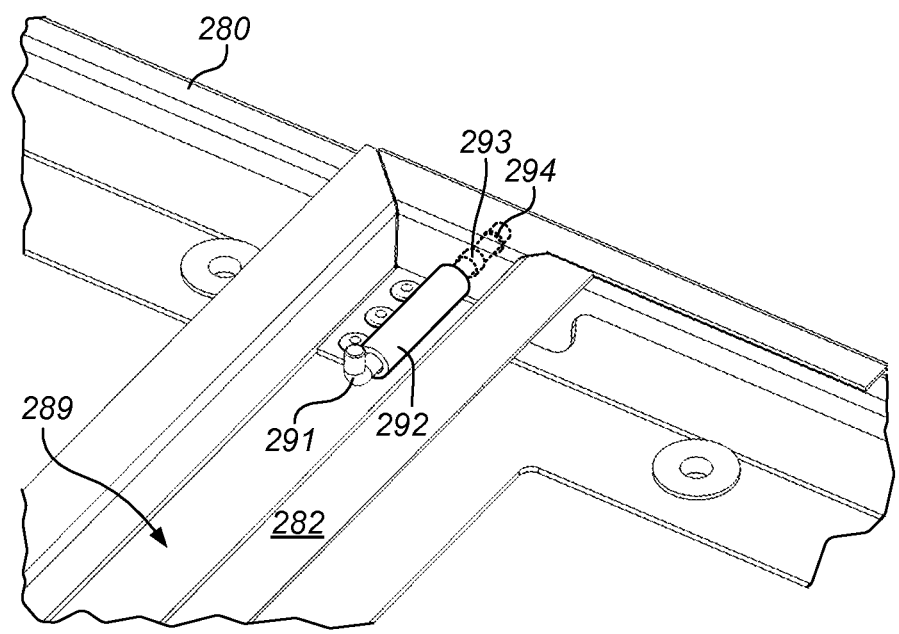
FIG. 24 illustrates one embodiment a locking mechanism for hard disk drive tray.

FIG. 24 illustrates one embodiment a locking mechanism for hard disk drive tray. Clamping bar 282 includes pin 291 and pin mounting bracket 292. Pin mounting bracket 292 is coupled to clamping bar 282 at the base of channel 289. Pin 291 is arranged to slide in pin mounting bracket 292. Clamping bar 282 includes through hole 293 for pin 291.

When clamping bar 282 is lowered to a closed position on hard disk drives 118, pin 291 and through hole 293 may align with hole 294 in base 280 of tray 222. Pin 291 may be advanced into hole 294. In certain embodiments, pin 291 may be spring-loaded into engagement in hole 294 of base 280. Engagement of pin 291 in hole of base 280 may retain clamping bar 282 in a locked position on hard disk drives 118.

Although in FIG. 24, clamping bar 282 is locked with pin 291, a tray assembly for hard disk drives may, in various embodiments, include other locking mechanisms and locking elements. Examples of locking mechanisms and elements include screws, cams, wedges, springs (for example, leaf springs), and detent mechanisms. In certain embodiments, hard disk drives may be coupled in a tray assembly by way of an interference fit between the hard disk drives and the tray.

Although the embodiments described above, the tray was used to mount hard disk drives in a raised position, in various embodiments a computer system may include any of various data storage devices mounted in a raised position.

Although in the embodiments, described above, all of the hard disk drives were mounted on a tray, in various embodiments, hard disk drives or other data storage devices may be mounted to a chassis using other mounting elements. For example, hard disk drives may be mounted on square tubes that support the drives and raise the drives above the bottom of a chassis.

In some embodiments, a tray may provide structural reinforcement for components in a chassis, such as hard disk drives. Referring again to FIG. 5, risers 283A, 283B, and 283C may couple with bottom panel 296 of chassis 112. In some embodiments, risers 283A, 283B, and 283C may rest on bottom panel 224. In other embodiments, risers 283A, 283B, and 283C may be attached to bottom panel 224, such as by screws, welding, or other manner of attachment. Side panels 223 and/or upper tabs 226 of chassis 112 may couple with peripheral frame 277 of tray 222. Elements of tray 222 and chassis 112 may combine to form a box section mounting for hard disk drives 118. For example, bottom panel 296, risers 283A and 283C, and support plate 281 may combine to form a rectangular box section. A box section may reduce deformation of a chassis, such as sagging of bottom panel 224, which might occur if hard disk drives 118 were installed directly on bottom panel 224 of chassis 112.

In some embodiments, a rack system includes rack-mounted fans external to computer systems in the rack. The rack-mounted fans may provide air flow through the computer systems. In the embodiment illustrated in FIG. 1, for example, system 100 includes fans 162.

Figure 25:
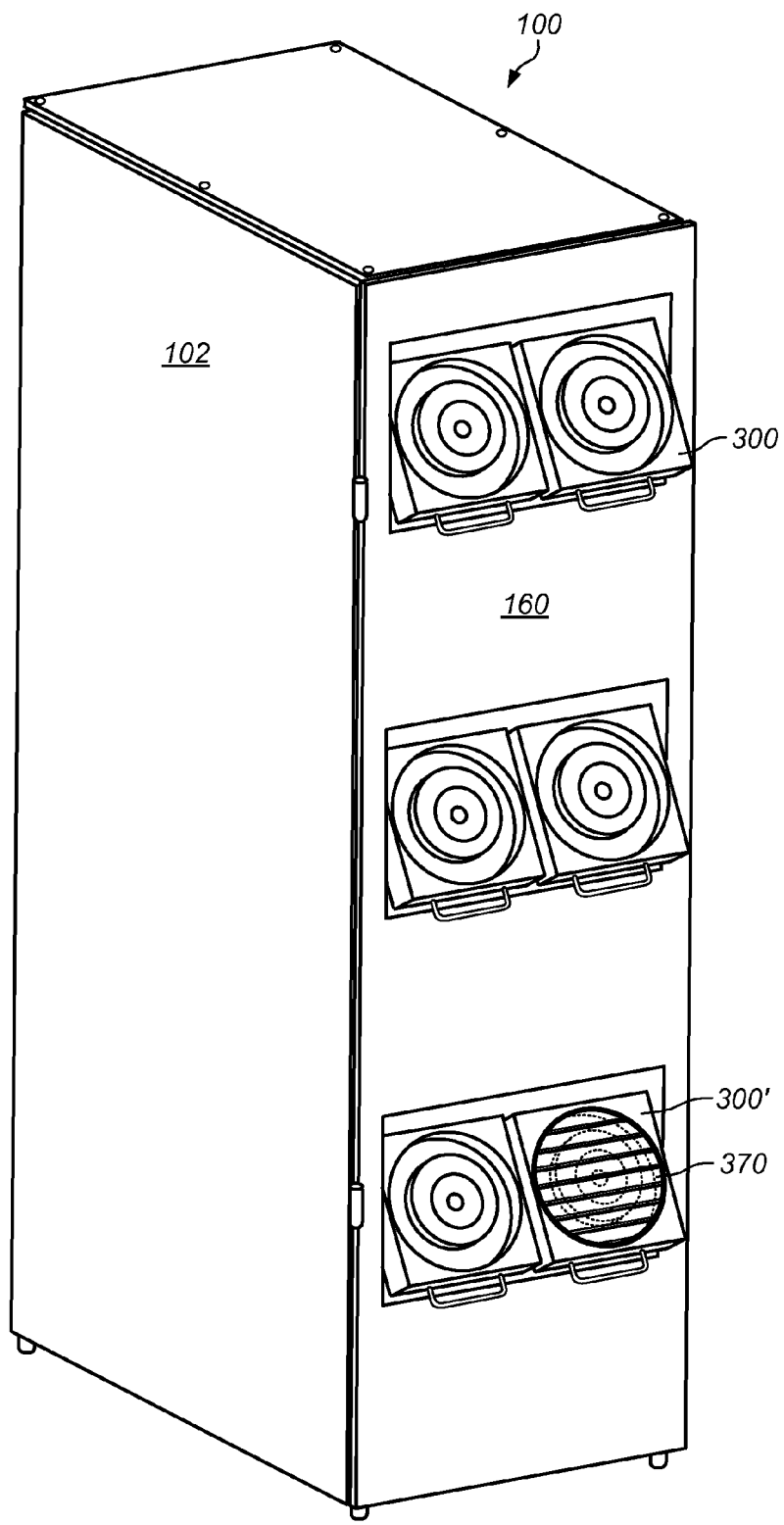
FIG. 25 illustrates a rear view of one embodiment of a rack system.

FIG. 25 illustrates a rear view of one embodiment of a rack system. System 100 includes rack 102 and rear door 160. Rear door 160 couples with rack 102 on hinges 148. Fan modules 300 couple with, and are supported by, rear door 160.

Figure 26:
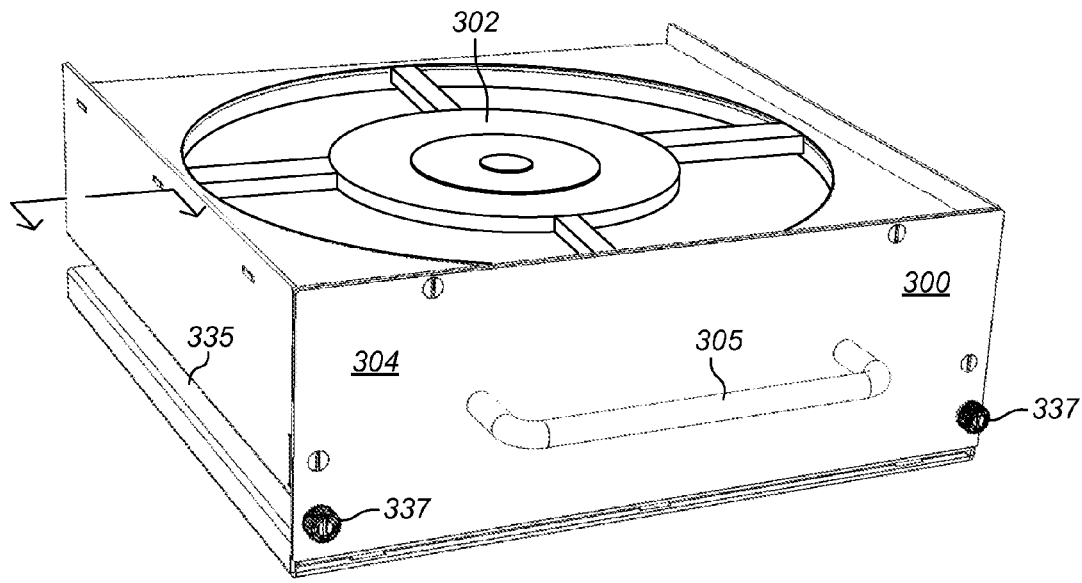
FIG. 26 illustrates one embodiment of a fan module for a rack.

FIG. 26 illustrates one embodiment of a fan module for a rack. Fan module 300 includes one or more fans 302 and case 304. Case 304 includes handle 305.

Figure 27:
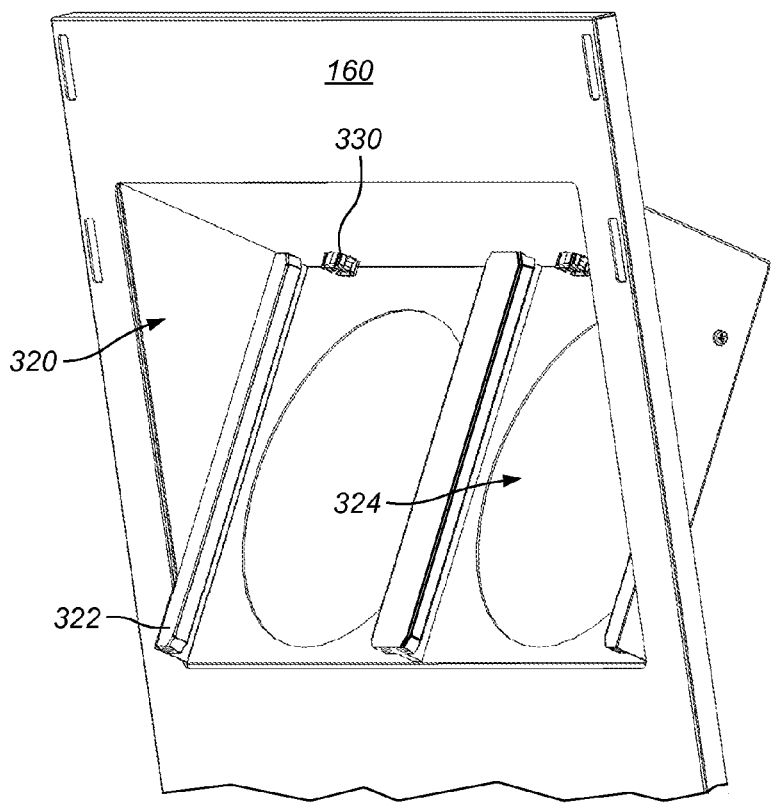
FIG. 27 illustrates one embodiment of a door for supporting fans in a rack system.

Fan module 300 may be mountable in a door of a panel (see, for example, rear door 160 shown in FIG. 25 and FIG. 27). Fans 302 may provide air flow in rack 102.

In some embodiments, fans 302 are alternating current (AC) fans. In one embodiment, fans 302 have an input voltage rating of about 100V-120 V. In one embodiment, fans 302 have an input voltage rating of about 230 V. Fans 302 may receive power from rack level power distribution units (such as rack power distribution unit 170 described above relative to FIG. 1). In some embodiments, fan modules 300 in a rack are hot swappable. In some embodiments, a manual power switch is provided for each of fan modules 300.

In one embodiment, each of fans 302 operates at a flow rate between 50 to 100 cubic feet per minute. In one embodiment, each of fans 302 operates at a flow rate about 200 cubic feet per minute.

FIG. 27 illustrates one embodiment of a door for supporting fans in a rack system. Door 160 includes fan module socket 320. Fan module socket 320 includes guides 322, openings 324, and blind-mate connectors 330. Each of guides 322 may engage a complementary channel on one of fan modules 300 when the fan module is installed in door 160. Each of blind-mate connectors 330 may couple with a complementary connector on one of fan modules 300 when the fan module is installed in door 160. In some embodiments, blind-mate connectors 330 may receive power through a cable harness (not shown in FIG. 27 for clarity). In some embodiments, the cable harness may supply each of receptacles 330 with power from an output power receptacle in a rack power distribution unit (such as rack power distribution unit 170).

Each of fans 302 may provide air flow for more than one computer system in rack 102. For example, as illustrated in FIG. 1, rack 104 may include computer systems 102, which may each be 1 U in height. In some embodiments, fans 300 combine to create a low pressure region at the rear of the rack.

In the embodiment shown in FIG. 1 and FIG. 25, a system includes three rows spaced from the top of rack to the bottom, with each row including two fans. In various embodiments, however, a system may have any number of fans. In some embodiments, a system has three or more fans per row. In some embodiments, a system has only one fan per row.

In some embodiments, rack-mounted fans for a system may be N+1 redundant. For example, in the embodiment shown in FIG. 1 and FIG. 25, if one of the six fans fails, the remaining five fans may provide adequate cooling for the system.

In some embodiments, fans are mounted in a rack at an angle relative to vertical. For example, as illustrated in FIG. 1, fans 162 are mounted at an angle relative to vertical. In certain embodiments, the angles of the fans in a rack are chosen to create a relatively uniform low pressure region at the rear of a stack of computer systems. In one embodiment, fans are angled at about 45 degrees from vertical. In another embodiment, fans are mounted at an angle that is near horizontal (for example, more than 80 degrees from vertical). The angles of fans in a rack may be the same or different.

Figure 28:
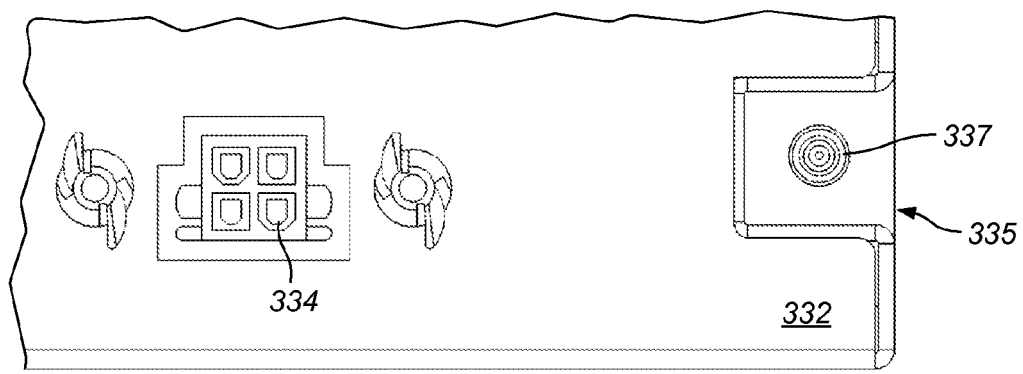
FIG. 28 illustrates a rear view of a portion of a fan module.

FIG. 28 illustrates a rear view of fan module 300. Rear panel 332 includes connector 334. Connector 334 may couple with a complementary connector on of a mounting panel, such as connector 330 on rack door 160. Channels 335 may be provided on both sides of fan module 300. Channels 335 may engage on guides 322 in fan module sockets 320 of rack door 160 when fan module 300 is installed in rack door 160.

Figure 29:
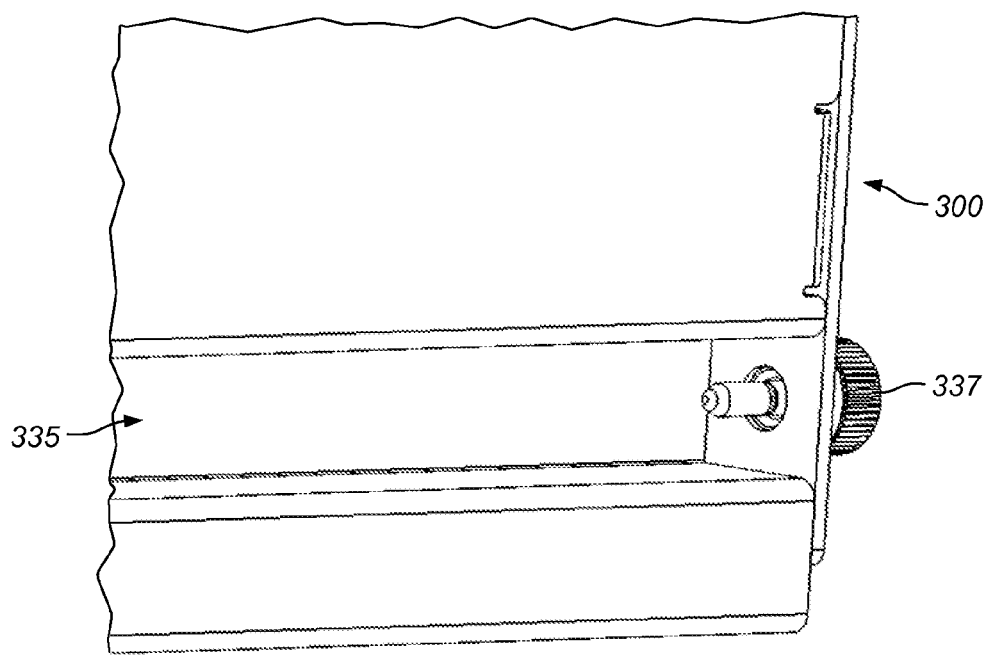
FIG. 29 illustrates a side view of a fan module.

FIG. 29 illustrates a side view of a fan module including a mounting channel. To install fan module 300, mounting channels 335 may be engaged on a pair of guides 322 shown in FIG. 27. Captive screws 337 may thread into tapped holes 336 of fan module sockets 320. In other embodiments, various other mechanisms may be used to couple a fan module to a rack. Such mechanisms may include, for example, a latch, a cam, or a clip. In one embodiment, a system includes a depressible latch mechanism for coupling a fan module to a rack. The latch mechanism may be operable with one hand to latch or remove the fan module from the rack.

Figure 30:
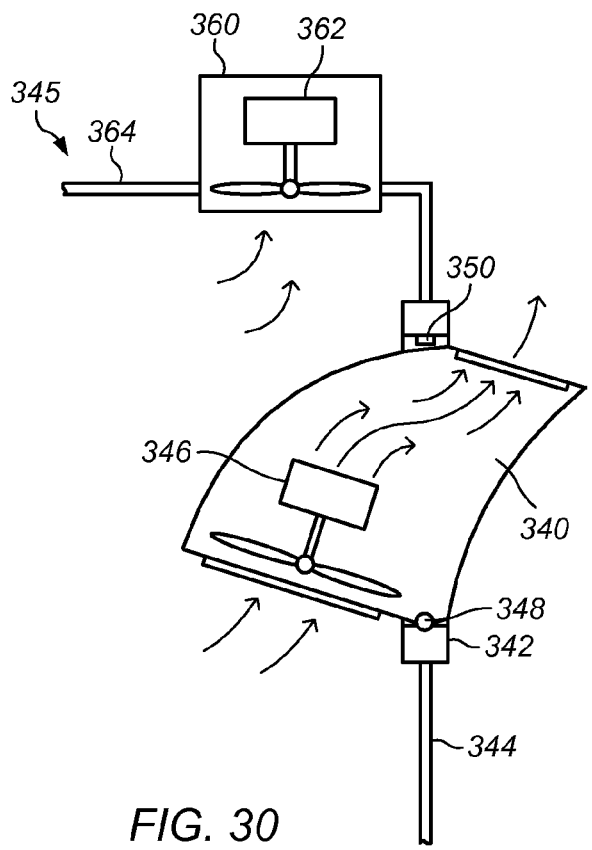
FIG. 30 illustrates one embodiment of a fan with an adjustable mounting.

In some embodiments, the angle of a rack-mounted fan is adjustable. FIG. 30 illustrates one embodiment of a fan with an adjustable mounting. System 338 includes fan module 340. Fan module 340 is rotatably coupled on fan module mount 342. Fan module mount 342 is mounted in rear panel 344 of rack 345. Fan module 340 includes fan 346.

Fan module 340 may be rotatably coupled to fan module mount 344. Fan module 340 is coupled to fan module mount 342 at pivot connection 348. The angle of fan module 342 may be adjusted by rotating fan module 340 on pivot connection 348.

Rack 345 includes roof fan module 360 mounted in roof 364. Fan 362 of roof fan module 360 may operate in combination with one or more fans 340 in rear panel 344 to provide a low pressure region in the rear portion of rack. In one embodiment, a rack includes one row of fans on the roof of a rack and two rows of fans spaced from top to bottom in the rear door of the rack.

Figure 31:
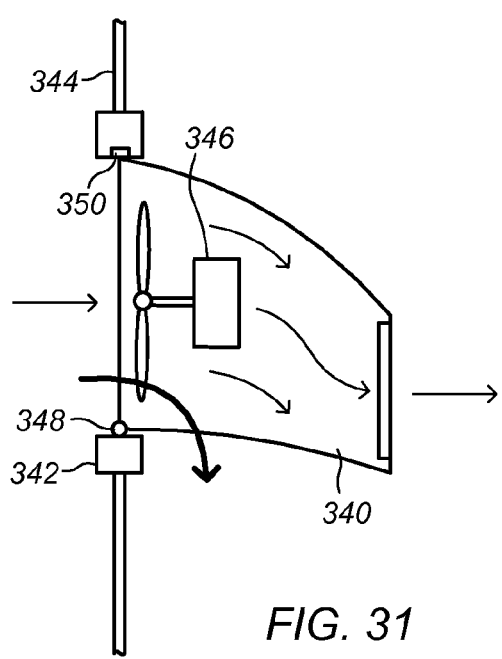
FIG. 31 illustrates an adjustable fan adjusted to a vertical angle.

FIG. 31 illustrates an adjustable fan adjusted to a vertical angle. In one embodiment, locking mechanism 350 is released to allow the angle of fan module 340 to be adjusted. Fan module 340 may be rotated on pivot connection 348 to a vertical angle. Once fan module 340 is in position, locking mechanism 350 may be operated to lock fan module 340 at the desired angle.

In some embodiments, a system may include variable speed fans. In certain embodiments, power switching and/or fan speed may be controlled automatically. Fans may be controlled individually, or in groups of two or more fans. In some embodiments, fans are controlled based on sensors data (for example, temperature sensors in the rack).

In some embodiments, one or more fans for a rack system may be controlled via a control system. Referring to FIG. 3, for example, rack 192A includes control system 380. Control system 380 may be coupled to fans 162. In certain embodiments, a control system includes at least one programmable logic controller. The PLC may receive measurements of conditions in the rack or at other locations in a data center. A PLC may receive data corresponding to air flow rate, temperature, pressure, humidity, or various other operating or environmental conditions.

In one embodiment, the PLC receives data from one or air flow sensors that measure airflow in the rack. Based on sensor data, the PLC may control parameters such as fan speed, as appropriate for the prevailing operational conditions. In another embodiment, the PLC receives data from one or more temperature sensors that measure temperature in the rack and/or at other locations in a data center. In certain embodiments, a PLC may modulate dampers between open and closed positions to modulate airflow, as appropriate for the prevailing operational conditions.

In some embodiments, a PLC may receive data from thermal sensors in a rack power distribution unit. In certain embodiments, a PLC may control switching in a rack power distribution unit.

In certain embodiments, angular adjustment of a fan may be automated. For example, the angle of fan module 340 relative to rack 102 may be controlled with an actuator coupled to the fan module. The actuator may be controlled by a PLC to adjust the angle of fan module 340.

In some embodiments, a system may include fan failure detection devices. In one embodiment, each of fan modules 300 is provided with a Hall effect sensor. The Hall effect sensor may provide a signal to a control system that a fan is not operating.

In some embodiments, one or more fans of a rack system may be provided with a device that automatically shuts off air flow through the fan if the rate of air flow through the fan drops below a predetermined threshold. For example, referring to FIG. 25, fan module 300' may include louvers 370. Louvers 370 may automatically close if air flow through fan module 300' drops below a predetermined level. For example, if fan module 300' fails, louvers 370 may automatically close to shut off air flow through the fan. Automatically shutting off air flow to a rack-mounted fan may reduce back flow of air into rack 102 in the event of a failure of fan module 300'. In some embodiments, all of the fan modules on a rack may include louvers for shutting off air flow in the event of a fan failure.

In certain embodiments, air flow through computer systems in a rack may be provided using fans internal to the computer systems instead of, or in addition to, rack-mounted fans. For example, a series of fans may be provided at the rear of the chassis of each of the computer systems in a rack (for example, downstream from hard disk drives 118 shown in FIG. 1). In certain embodiments, air flow for computer systems in a rack may be produced by an air handling system external to the rack.

In some embodiments, a power system for fans in a rack may include back-up power. Back-up power may be implemented, for example, in the event of a failure of a primary rack power distribution unit. In some embodiments, power to fans in a rack is automatically switched from a primary rack power distribution unit to a reserve power rack power distribution unit upon failure of the primary rack power distribution unit.

Referring again to FIG. 3, data center 190 includes fan power distribution system 378. Fan power distribution system 378 includes automatic transfer switch 390, primary power cable 392, reserve power cable 394, and fan power cable 396. During normal operation, fans 162 may receive power from primary rack power distribution unit 170A on the left side of rack 192. Power from primary rack power distribution unit 170A may be supplied through primary power cable 392, automatic transfer switch 390, and fan power cable 396. In the event of a failure of rack power distribution unit 170A (or in the primary power system upstream from primary rack power distribution unit 170A), automatic transfer switch 390 may automatically switch to reserve power. In the reserve power mode, reserve rack power distribution unit 170B may supply power to fans 162 through reserve power cable 394, automatic transfer switch 390, and fan power cable 396. In some embodiments, each of primary rack power distribution unit 170A and reserve rack power distribution unit 170B are movably coupled to the rack, such as rack power distribution unit 170 described above relative to FIG. 1.

Automatic transfer switch 390 may be placed or mounted in any of various suitable locations. In one embodiment, automatic transfer switch 390 is mounted on the roof of a rack. In another embodiment, automatic transfer switch 390 is mounted on the rear door of a rack.

Figure 32:
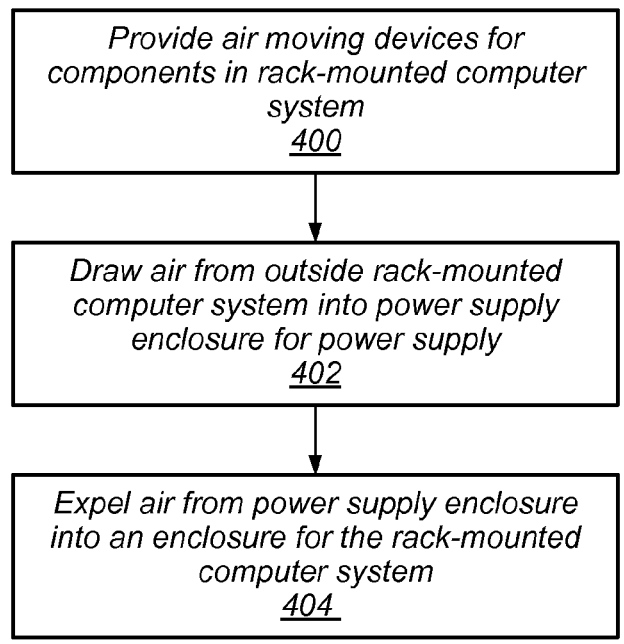
FIG. 32 illustrates a method of cooling components in a rack-mounted computer system according to one embodiment.

FIG. 32 illustrates a method of cooling components in a rack-mounted computer system according to one embodiment. At 400, air moving devices are provided for heat producing components in a rack-mounted computer system. The air moving devices may be, for example, a fan in a power supply unit and/or a fan mounted in the rack. In some embodiments, an air moving device is an internal fan in a power supply unit that has been modified to reverse the direction of air flow in the power supply unit.

At 402, air is drawn from outside the rack-mounted computer system into a power supply enclosure for the power supply unit. At 404, air is expelled from the power supply enclosure into an enclosure for the rack-mounted computer system.

Figure 33:
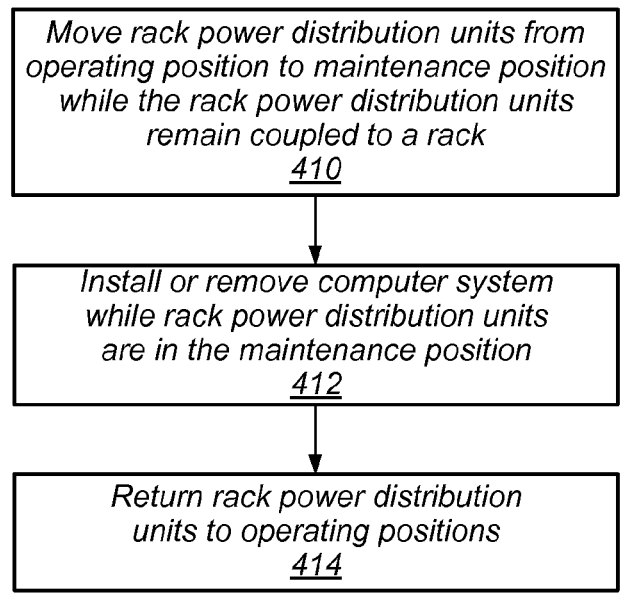
FIG. 33 illustrates one embodiment of a reconfiguration or maintenance operation that includes moving rack power distribution units to access computer systems in a rack.

In an embodiment, rack power distribution units in a rack are moved to allow access to computer systems in the rack so that reconfiguration or maintenance operation can be performed on the computer systems. FIG. 33 illustrates one embodiment of a reconfiguration or maintenance operation that includes moving rack power distribution units to access computer systems in a rack. At 410, rack power distribution units installed in the rack are moved from an operating position to a maintenance position while the rack power distribution units remain coupled to the rack. For example, rack power distribution units may be rotated on brackets that are coupled to the rack by way of hinges. Moving the rack power distribution units may take the rack power distribution units out of an installation/removal path for computer systems in the rack.

At 412, a computer system in the rack is at least partially installed or removed while the rack power distribution unit is in the maintenance position. In some embodiments, a computer system is entirely removed from the rack and replaced by another computer system. In some embodiments, a reconfiguration or maintenance operation is performed on a computer system is performed while the computer system is partially installed in the rack (for example, slid out but still on the rails). For example, a cover on the computer system may be removed and a circuit board assembly, power supply unit, or a hard disk drive, may be replaced. In either case, once the computer systems have been placed or replaced in their fully installed positions, the rack power distribution units may be returned to their operating positions at 414.

Figure 34:
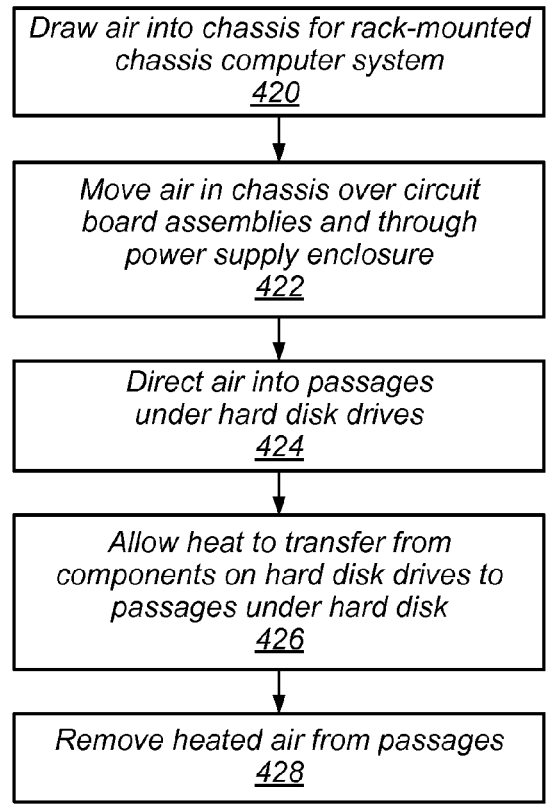
FIG. 34 illustrates a method of cooling hard disk drives by flowing air under the drives according to one embodiment.

In an embodiment, a method of cooling computer systems in a rack includes directing air under hard disk drives in a rack-mountable computer system. FIG. 34 illustrates a method of cooling hard disk drives by flowing air under the drives according to one embodiment. At 420, air is drawn into a chassis for a rack-mounted chassis computer system. At 422, air passing into the chassis may flow over circuit board assemblies and/or through an enclosure for a power supply unit. At 424, air is directed into passages under hard disk drives of the computer system. In some embodiments, air is directed downwardly into the passages. In some embodiments, some or all of the air passing through a chassis may be blocked from passing over the hard disk drives. Blocking air from passing may force more air to flow under the hard disk drives and/or increase the velocity of air flowing under the hard disk drives.

At 426, heat from heat producing components on the hard disk drives may transfer to air in the passages under the hard disk drives. At 428, air is removed from the passages.

In some embodiments, directing the air under the hard disk drive includes pulling air downwardly into passages under hard disk drives. For example, in the embodiment shown in FIG. 6, air may be drawn downwardly within chassis 104. In some embodiments, air is pulled through with rack-mounted fans at the rear of a rack, such as fans 162 shown in FIG. 1.

Figure 35:
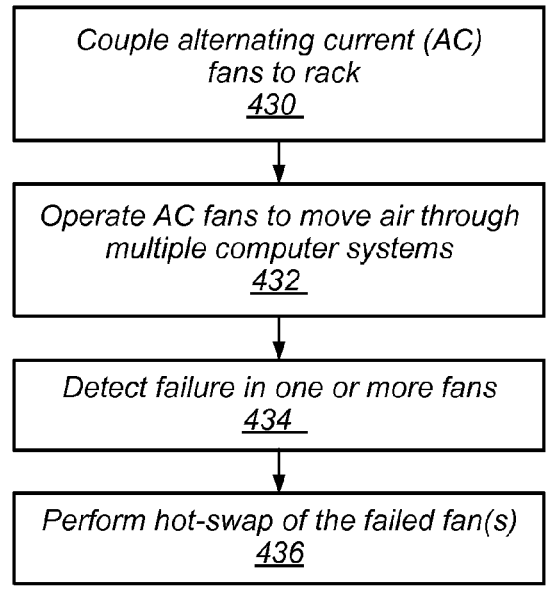
FIG. 35 illustrates a method of cooling computer systems using rack-mounted fans according to one embodiment.

In an embodiment, a method of cooling rack-mounted computer systems includes using rack-mounted AC fans that move air through multiple computer systems mounted in the rack. FIG. 35 illustrates a method of cooling computer systems using rack-mounted fans according to one embodiment. At 430, AC fans are coupled to a rack. In some embodiments, the fans are coupled to the rack in an angular orientation relative to the rack.

At 432, the AC fans are operated to move air through computer systems in the rack such that at least one of the AC fans moves air through multiple computer systems mounted in the rack. For example, a single fan may move air through rack-mounted computer systems at two or more positions in the rack (for example, two or more servers located one on top of another in the rack).

At 434, a failure is detected in one of the fans. At 436, a hot-swap is performed for the failed fan. During the hot-swap, the fan module that houses the failed fan is removed and replaced. During such removal and replacement, power may be maintained at the location of the fan module and/or to other fans in the rack.

In various embodiments described above, rack power distribution units are installed on brackets near the ends of rack systems. A rack power distribution unit may, however, be installed in any part of a rack in various embodiments. For example, a rack power distribution unit may be installed on a hinged bracket near the middle of a rack.

Although in the embodiments described above, some of the computer systems have been described as 1 U in height, computer systems may in various embodiments be 2 U, 3 U, or any other height or dimensions.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A system comprising:
a rack;
computer systems mounted in the rack from a front side of the rack and from a back side of the rack on one or more same levels of the rack;
a rack power distribution unit coupled to the rack on the front side of the rack, wherein the rack power distribution unit is configured to supply power to a portion of the computer systems mounted in the rack; and
another rack power distribution unit coupled to the rack on the back side of the rack, wherein the other rack power distribution unit is configured to supply power to another portion of the computer systems mounted in the rack.

2. The system of claim 1, wherein the system is configured such that:
air is received into the rack from a cold aisle on the front side of the rack and
air is received into the rack from a cold aisle on the back side of the rack.

3. The system of claim 2, wherein the computer systems mounted in the rack are half-depth servers,
wherein the portion of the computer systems that is supplied power from the rack power distribution system on the front side of the rack comprise half-depth servers that receive air from the cold aisle on the front side of the rack; and
wherein the portion of the computer systems that is supplied power from the other rack power distribution system on the back side of the rack comprise half-depth servers that receive air from the cold aisle on the back side of the rack.

4. The system of claim 1, wherein one of the computer systems mounted in the rack is a half-depth server that comprises:
a tray comprising risers configured to elevate the tray above a surface of a chassis of the half-depth server; and
mass storage devices coupled to the tray at an elevated position above the chassis of the half-depth server,
wherein the tray is configured to permit air to flow in a space between the tray and the chassis of the half-depth server to remove waste heat from the mass storage devices coupled to the tray.

5. The system of claim 4, wherein the half-depth server further comprises:
a circuit board assembly communicatively coupled with the mass storage devices; and
a power supply unit;
wherein the half-depth server is configured to receive air from a cold aisle and direct a portion of the air across the circuit board assembly and a portion of the air across the power supply unit,
wherein the half-depth server is further configured to direct the air that has passed across the circuit board assembly and the air that has passed across the power supply unit into the space between the tray and the chassis and across the mass storage devices to remove waste heat from the mass storage devices.

6. The system of claim 1, wherein the rack further comprises:
a mid column, wherein the mid column is configured to receive heated air that has passed across mass storage devices of half-depth servers mounted in the rack and direct the heated air toward a top side of the rack.

7. A system comprising:
a rack configured to mount computer systems in the rack from a front side of the rack and from a back side of the rack on one or more same levels of the rack,
wherein the rack comprises:
a coupling mechanism configured to couple a power distribution unit to the rack on the front side of the rack to provide power to at least a portion of the computer systems; and
an additional coupling mechanism configured to couple an additional power distribution unit to the rack on the back side of the rack to provide power to at least another portion of the computer systems.

8. The system of claim 7, wherein the rack comprises:
a mid column, wherein the mid column is configured to receive heated air that has passed across mass storage devices of half-depth servers mounted in the rack and direct the heated air toward a top side of the rack.

9. The system of claim 8, further comprising half-depth servers mounted in the rack, wherein one of the half-depth servers comprises:
a tray comprising risers configured to elevate the tray above a surface of a chassis of the half-depth server; and
mass storage devices coupled to the tray at an elevated position above the chassis of the half-depth server,
wherein the tray is configured to receive air from a front side of the rack and direct the air to flow in a space between the tray and the chassis of the half-depth server to remove waste heat from the mass storage devices coupled to the tray; and
wherein another one of the half-depth servers comprises:
a tray comprising risers configured to elevate the tray above a surface of a chassis of the other half-depth server; and
mass storage devices coupled to the tray at an elevated position above the chassis of the other half-depth server,
wherein the tray is configured to receive air from a back side of the rack and direct the air to flow in a space between the tray and the chassis of the other half-depth server to remove waste heat from the mass storage devices coupled to the tray.

10. The system of claim 9, wherein the half-depth server or the other half-depth server further comprises:
an opening in the tray configured to permit a portion of the air flowing in the space between the tray and the chassis to flow through the opening and across a mass storage device coupled to the tray.

11. The system of claim 9, wherein the half-depth server or the other half-depth server further comprises:
clamping bars pivotally coupled to a base of the tray and configured to secure the mass storage devices coupled to the tray between the base of the tray and the clamping bars.

12. The system of claim 7, wherein the rack is configured to mount:
a set of the half-depth servers in the rack from the front side of the rack; and
another set of the half-depth servers in the rack from the back side of the rack.

13. A half-depth server comprising:
a chassis having a depth equivalent to half a depth of a standard rack;
a circuit board assembly mounted in the chassis;
a tray comprising risers configured to elevate the tray above a surface of the chassis; and
mass storage devices coupled to the tray.

14. The half-depth server of claim 13, wherein the tray further comprises:
openings configured to permit a portion of an air flow in a space between the tray and the chassis to flow through the openings and across respective ones of the mass storage devices coupled to the tray.

15. The half-depth server of claim 13, wherein the system further comprises:
pads coupled between the mass storage devices and the tray, wherein the pads are configured to dissipate vibrations.

16. The half-depth server of claim 13, wherein the system further comprises:
clamping bars pivotally coupled to a base of the tray.

17. The system of claim 16, wherein the clamping bars further comprise:
multiple wings configured to secure the mass storage devices.

18. The system of claim 17, wherein one of the wings further comprises:
a locking bar having an inverse hat shape, wherein the locking bar is configured to engage edges of the mass storage devices to secure the mass storage devices.

19. The system of claim 16, wherein the clamping bars further comprise:
a locking mechanism configured to secure the clamping bar to the base of the tray in a closed position.

20. The system of claim 16 further comprising a biasing mechanism configured to bias the clamping bar against the mass storage devices to secure the mass storage devices.

* * * * *